(12) United States Patent
Suzuki

(10) Patent No.: US 11,119,298 B2
(45) Date of Patent: Sep. 14, 2021

(54) INFRARED IMAGING LENS SYSTEM

(71) Applicant: KYOCERA Corporation, Kyoto (JP)

(72) Inventor: Akihiko Suzuki, Tokyo (JP)

(73) Assignee: KYOCERA CORPORATION, Kyoto (JP)

(*) Notice: Subject to any disclaimer, the term of this patent is extended or adjusted under 35 U.S.C. 154(b) by 274 days.

(21) Appl. No.: 15/995,136

(22) Filed: Jun. 1, 2018

(65) Prior Publication Data

US 2018/0275378 A1 Sep. 27, 2018

Related U.S. Application Data

(63) Continuation of application No. PCT/JP2016/085473, filed on Nov. 30, 2016.

(30) Foreign Application Priority Data

Dec. 3, 2015 (JP) .............................. JP2015-236958

(51) Int. Cl.
G02B 13/14 (2006.01)
G02B 13/18 (2006.01)
H01L 31/0232 (2014.01)
G02B 5/18 (2006.01)

(52) U.S. Cl.
CPC ......... *G02B 13/146* (2013.01); *G02B 5/1814* (2013.01); *G02B 13/14* (2013.01); *G02B 13/18* (2013.01); *H01L 31/02325* (2013.01)

(58) Field of Classification Search
CPC ...... G02B 13/14; G02B 13/145; G02B 13/18; G02B 13/003; G02B 5/18; G02B 5/1814; G02B 9/10; G02B 9/06; G02B 9/08; G02B 13/146; H01L 31/0232; H01L 31/02325

USPC ................. 359/355, 356, 691, 717, 793–795
See application file for complete search history.

(56) References Cited

U.S. PATENT DOCUMENTS

| 2012/0113504 A1 | 5/2012 | Tanami et al. | |
| 2012/0176668 A1* | 7/2012 | Saito ........................ | G02B 9/34 359/357 |
| 2013/0120832 A1* | 5/2013 | Lee .......................... | G02B 13/14 359/356 |

(Continued)

FOREIGN PATENT DOCUMENTS

| CN | 103257431 | 8/2013 |
| CN | 103543516 | 1/2014 |

(Continued)

OTHER PUBLICATIONS

"Search Report of European Counterpart Application," dated Oct. 29, 2018, p. 1-p. 7.

(Continued)

Primary Examiner — Jie Lei
(74) Attorney, Agent, or Firm — JCIPRNET

(57) ABSTRACT

An infrared imaging lens system comprises, in order from an object side, a first lens formed of silicon whose minimum transmittance of infrared rays with a wavelength of 8 μm to 13 μm is at least 40% for a thickness of 1 mm, and a second lens formed of chalcogenide glass. The silicon whose minimum transmittance of infrared rays with a wavelength of 8 μm to 13 μm is at least 40% for a thickness of 1 mm can be obtained at low cost for example by controlling the oxygen concentration in CZ method.

6 Claims, 14 Drawing Sheets

(56) References Cited

U.S. PATENT DOCUMENTS

| | | | |
|---|---|---|---|
| 2013/0182316 A1* | 7/2013 | Fuse | G02B 13/14 359/356 |
| 2015/0085353 A1 | 3/2015 | Kawaguchi et al. | |
| 2018/0267276 A1* | 9/2018 | Kuiseko | G02B 13/008 |

FOREIGN PATENT DOCUMENTS

| | | |
|---|---|---|
| JP | 2010-113191 | 5/2010 |
| JP | 2011-128538 | 6/2011 |
| JP | 2011-237669 | 11/2011 |
| JP | 2012-103461 | 5/2012 |
| JP | 2012-141522 | 7/2012 |
| JP | 2015-060194 | 3/2015 |
| WO | 2015029645 | 3/2015 |

OTHER PUBLICATIONS

"International Search Report (Form PCT/ISA/210) of PCT/JP2016/085473", dated Mar. 7, 2017, with English translation thereof, pp. 1-2.

"Written Opinion (Form PCT/ISA/237)", dated Mar. 7, 2017, with English translation thereof, pp. 1-9.

* cited by examiner

Example 1

FIG.5A
FIG.5B
FIG.5C
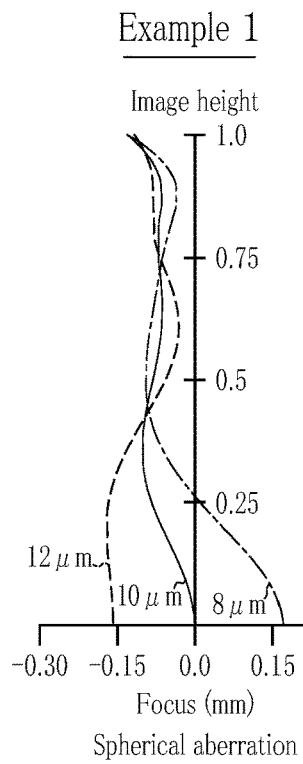
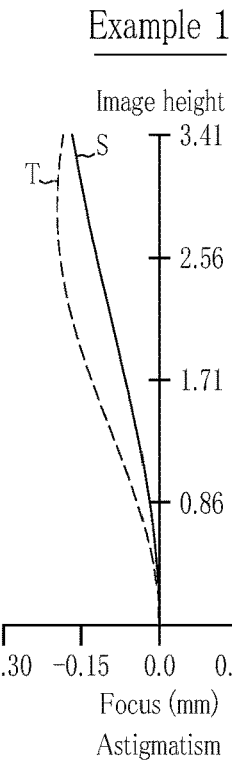
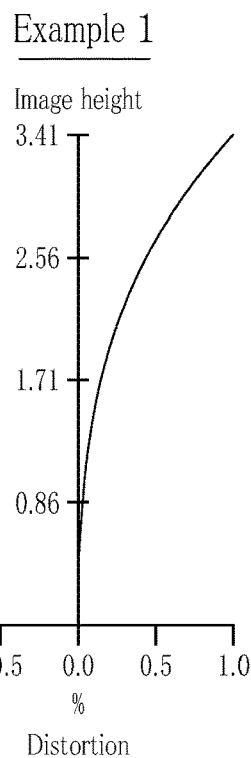
FIG.6
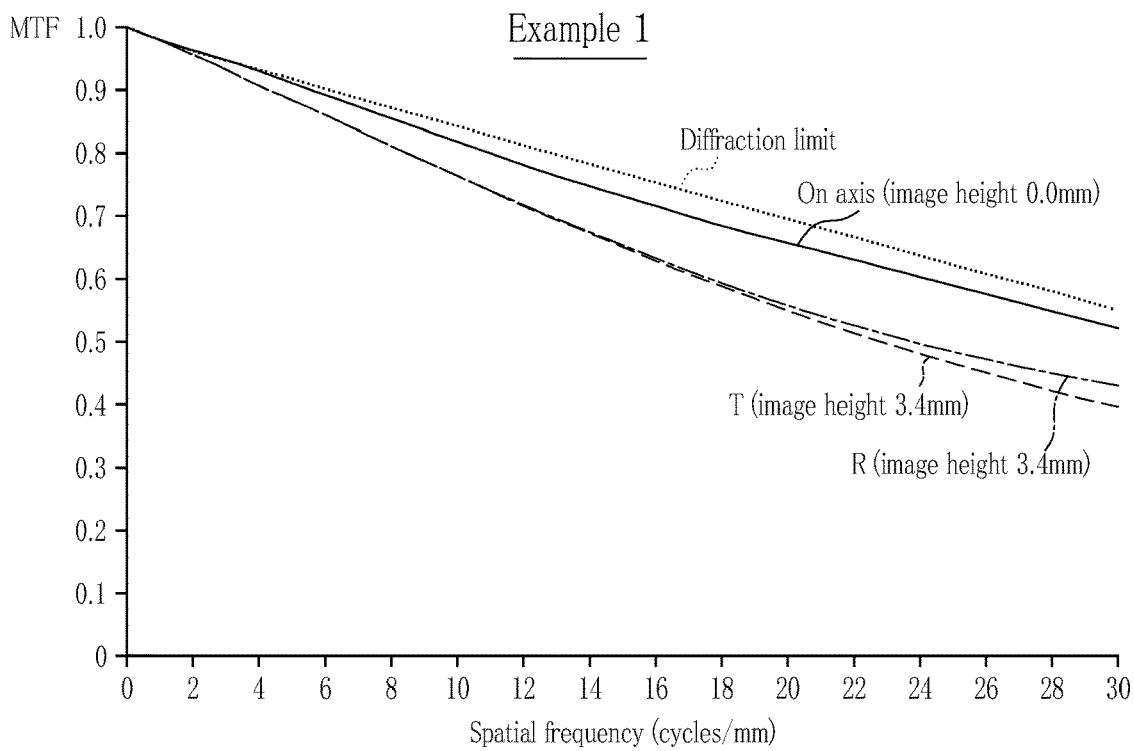

Focus (mm)
Spherical aberration

Focus (mm)
Astigmatism

%
Distortion

Example 3

Spherical aberration

Example 3

Astigmatism

Example 3

Distortion

Example 4

Example 4

Focus (mm)
Spherical aberration

Example 4

Focus (mm)
Astigmatism

Example 4

%
Distortion

Example 4

Example 5

Example 5

Focus (mm)
Spherical aberration

Example 5

Focus (mm)
Astigmatism

Example 5

%
Distortion

Spatial frequency (cycles/mm)

FIG.19
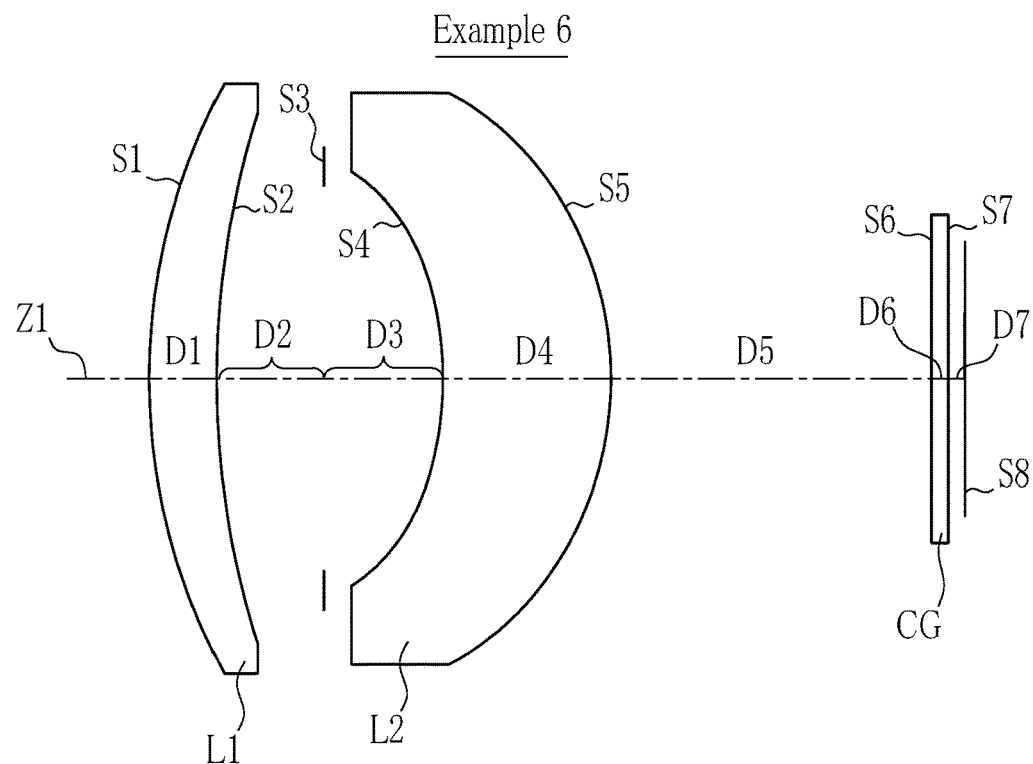
Example 6
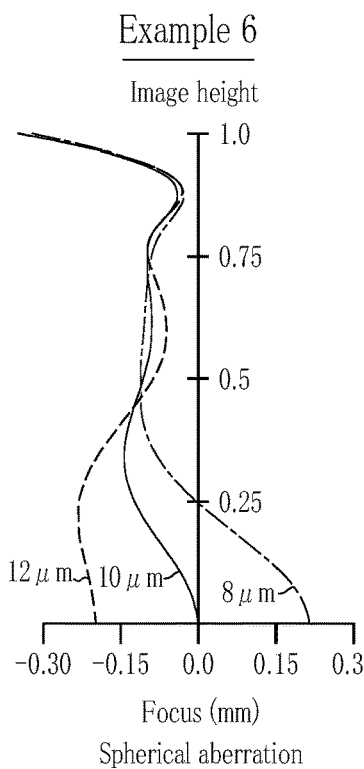
FIG.20A
Example 6
Spherical aberration
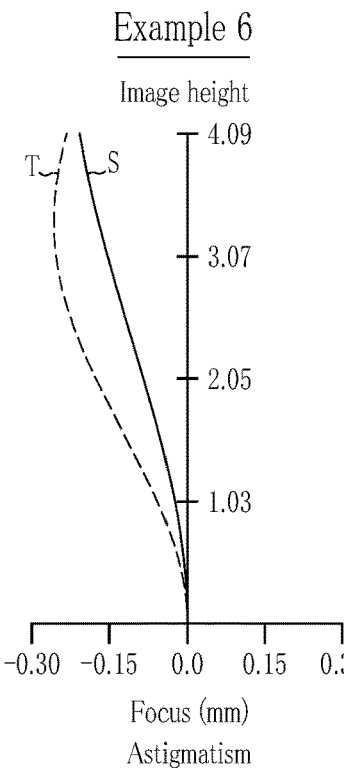
FIG.20B
Example 6
Astigmatism
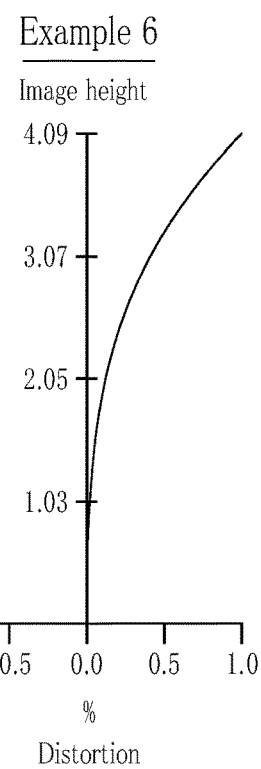
FIG.20C
Example 6
Distortion Example 7
Spherical aberration Example 7
Astigmatism Example 7
Distortion

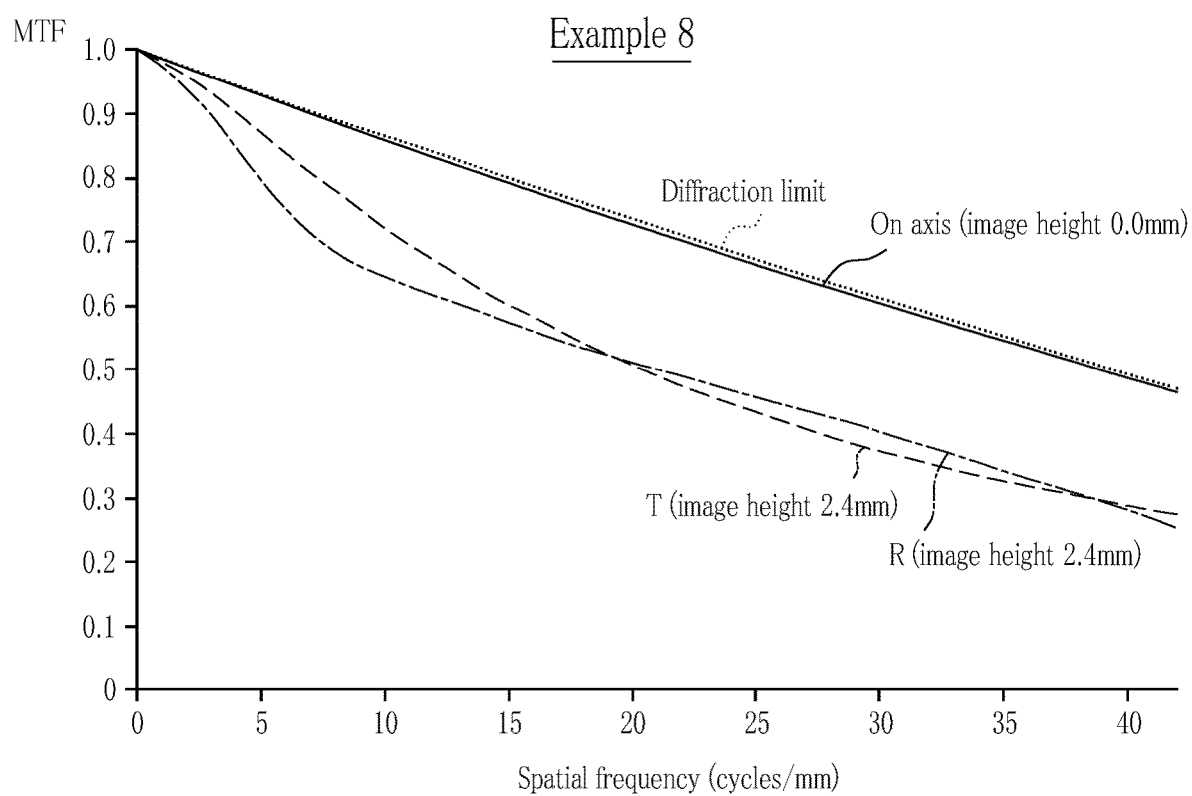

INFRARED IMAGING LENS SYSTEM

CROSS-REFERENCE TO RELATED APPLICATIONS

This application is a Continuation of PCT International Application No. PCT/JP2016/085473 filed on 30 Nov. 2016, which claims priority under 35 U.S.C § 119(a) to Japanese Patent Application No. 2015-236958 filed on 3 Dec. 2015. The above application is hereby expressly incorporated by reference, in its entirety, into the present application.

BACKGROUND OF THE DISCLOSURE

1. Field of the Disclosure

The present application relates to an infrared imaging lens system for forming an image of an object on an imaging surface of an image sensor with infrared rays.

2. Description of the Related Art

In recent years, surveillance cameras, in-vehicle cameras and so on for photographing subjects such as surrounding environments with so-called far infrared rays (infrared rays having a wavelength of about 3 μm to 15 μm) are in widespread use. As a matter of course, a lens made of a material having a high infrared transmittance is used for an infrared imaging lens system mounted on these cameras. For example, chalcogenide glass, ZnS (zinc sulfide), Ge (germanium), or ZnSe (zinc selenide) is used for infrared imaging lenses of JP2010-113191A, JP2011-128538A, JP2011-237669A, and JP2012-103461A (corresponding to US2012/113504A1). In addition, sapphire and the like which also have high transmittance to infrared rays can be used for infrared imaging lens.

SUMMARY OF THE DISCLOSURE

Since infrared imaging lenses must have a high transmittance for infrared rays, relatively few materials are usable for infrared imaging lenses. However, these materials are all expensive. In particular, in case of using crystal materials, infrared imaging lenses become very expensive since it is necessary to form an aspheric surface by grinding. The expensiveness of infrared imaging lenses is one of the reasons for delaying the spread of surveillance cameras and in-vehicle cameras for photographing surrounding environments and so on with far infrared rays. Therefore, it is required to manufacture and sell infrared imaging lenses at a lower cost.

Among the materials commonly used for infrared imaging lenses, chalcogenide glass is relatively inexpensive and has a merit that an aspheric surface can be formed by molding to easily obtain desired optical performance. For this reason, chalcogenide glass is often used in recent infrared imaging lenses like the infrared imaging lenses of JP2010-113191A, JP2011-128538A, JP2011-237669A, and JP2012-103461A. Although chalcogenide glass is relatively inexpensive among materials which have been conventionally used for infrared imaging lenses, it is still very expensive compared to materials used for lenses for imaging a subject with visible light (hereinafter referred to as visible light imaging lenses).

For visible light imaging lenses, inexpensive materials such as resin and synthetic quartz ($SiO_2$) are used, but infrared rays (especially far infrared rays) are easily absorbed by these materials. For example, synthetic quartz can be used also for infrared imaging lenses from the viewpoint of weather resistance and temperature dependency, but it has a disadvantage that it strongly absorbs infrared rays around 9 μm. Accordingly, in the case where synthetic quartz is used for an infrared imaging lens, it is difficult to obtain a desired image due to insufficient imaging light amount and so on. Therefore, synthetic quartz has not been used for conventional infrared imaging lenses, as can be understood from the fact that it is not used in JP2010-113191A, JP2011-128538A, JP2011-237669A, JP2012-103461A and so on.

Synthetic quartz absorbs infrared rays in the vicinity of 9 μm because it contains oxygen in addition to silicon (Si). Accordingly, a silicon crystal containing no oxygen can be used as a material for infrared imaging lenses, because it suppresses absorption of infrared rays in the vicinity of 9 μm. However, silicon crystals not containing oxygen are usually manufactured by FZ method (Floating Zone method) which causes cost increase. For this reason, conventional infrared imaging lenses do not use silicon crystal or the like as a material.

In addition to the FZ method, for example CZ method (Czochralski method) is known as a typical method for producing silicon crystals. Although the CZ method can obtain silicon crystals at a lower cost than the FZ method, silicon crystals made by the CZ method easily contain many impurities such as oxygen, thus it had been difficult to obtain pure silicon crystal by this method. However, in recent years, it becomes possible to control the amount of impurities such as oxygen even in the CZ method. Accordingly, it becomes possible to obtain silicon crystals with lower concentration of contained oxygen (hereinafter referred to as oxygen concentration) at low cost, whose absorption of far infrared rays is suppressed. Therefore, it is desired to provide an infrared imaging lens at lower cost by using a silicon crystal with suppressed far infrared absorption.

Since silicon had not been able to be used for conventional infrared imaging lenses, infrared imaging lenses using silicon are not known. In addition, since the performance of lenses greatly depends on materials to be used, simply replacing conventional expensive infrared materials with silicon cannot obtain images with desired image quality for surveillance cameras and in-vehicle cameras.

The present application provides an infrared imaging lens system more inexpensively than before by using silicon which has a low oxygen concentration to such an extent as to be used for infrared rays and suppresses absorption of infrared rays in the vicinity of 9 μm.

An infrared imaging lens system according to an embodiment comprises, in order from an object side, a first lens formed of silicon whose minimum transmittance of infrared rays with a wavelength of 8 μm to 13 μm is at least 40% for a thickness of 1 mm, and a second lens formed of chalcogenide glass. The infrared imaging lens system further comprises an aperture stop is disposed between the first lens and the second lens. The first lens is a meniscus lens convex to the object side, and the second lens is a meniscus lens convex to the image side.

It is preferable that an object side surface of the first lens is spherical, and an image side surface of the first lens is spherical.

It is preferable that an object side surface of the second lens is aspherical, and an image side surface of the second lens is aspherical.

It is preferable that the object side surface of the second lens is a diffractive surface.

It is preferable that a following formula is satisfied where f represents a focal length of the entire system, and f1 represents a focal length of the first lens:

$$1.1 \leq f1/f \leq 1.6 \quad \text{(Formula 1)}$$

It is preferable that a following formula is satisfied where D1 represents a center thickness of the first lens, and D4 represents a center thickness of the second lens:

$$1.6 \leq D4/D1 \leq 6.0 \quad \text{(Formula 2)}$$

It is preferable that a following formula is satisfied where R1 represents a curvature radius of the object side surface of the first lens, and R2 represents a curvature radius of the image side surface of the first lens:

$$1.25 \leq R2/R1 \leq 1.70 \quad \text{(Formula 3)}$$

It is preferable that a following formula is satisfied where f1 represents a focal length of the first lens, and Δ represents a length between the image side surface of the first lens and the object side surface of the second lens:

$$2.4 \leq f1/\Delta \leq 3.2 \quad \text{(Formula 4)}$$

Since the present application uses the lens formed of silicon whose minimum transmittance of infrared rays with a wavelength of 8 μm to 13 μm is at least 40% for a thickness of 1 mm, it is possible to provide an infrared imaging lens at a lower cost than before.

BRIEF DESCRIPTION OF THE DRAWINGS

FIG. 5A is a graph which illustrates spherical aberration in Example 1.
FIG. 5B is a graph which illustrates astigmatism in Example 1.
FIG. 5C is a graph which illustrates distortion in Example 1.
FIG. 6 is a graph illustrating MTF for spatial frequency in Example 1.
FIG. 19 is a configuration diagram of an infrared imaging lens system of Example 6.
FIG. 20A is a graph which illustrates spherical aberration in Example 6.
FIG. 20B is a graph which illustrates astigmatism in Example 6.
FIG. 20C is a graph which illustrates distortion in Example 6.
FIG. 27 is a graph illustrating MTF for spatial frequency in Example 8.

DESCRIPTION OF THE PREFERRED EMBODIMENTS

Figure 1:
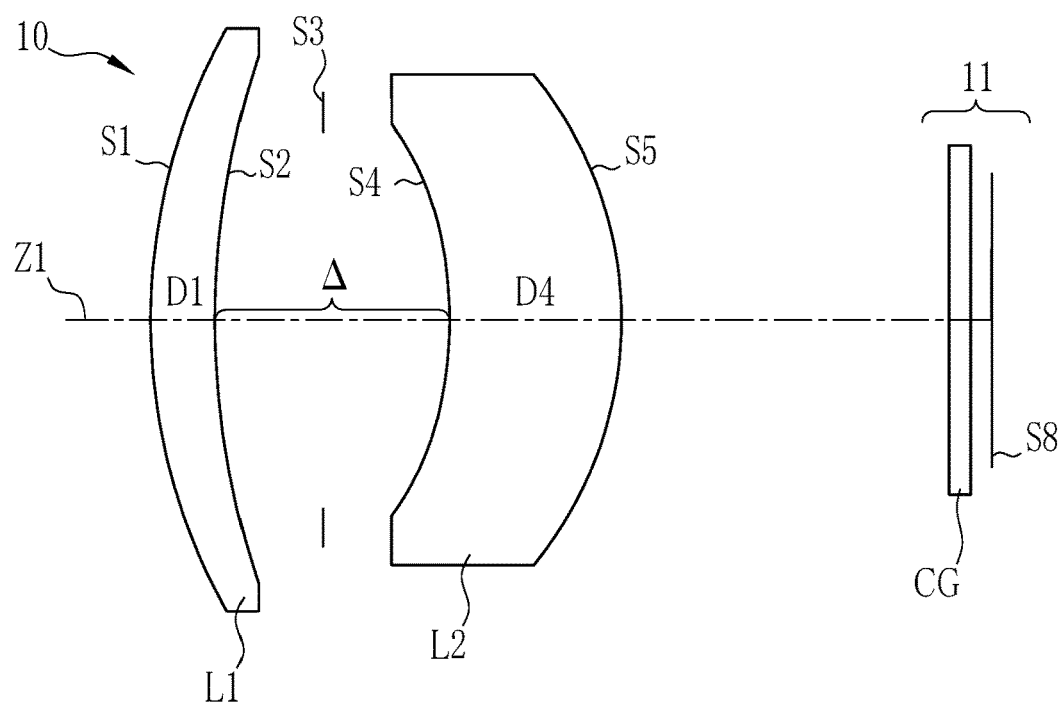
FIG. 1 is a configuration diagram of an infrared imaging lens system.

As illustrated in FIG. 1, an infrared imaging lens system 10 is a lens system for forming an image of an object on an imaging surface S8 of an image sensor 11 by far infrared rays. The infrared imaging lens system 10 is a two-lens system having a first lens L1 and a second lens L2 arranged in order from the object side along an optical axis Z1. In addition, the infrared imaging lens system 10 comprises an aperture stop S3 between the first lens L1 and the second lens L2. Since the imaging surface S8 of the image sensor 11 is protected with a cover glass CG, the infrared imaging lens system 10 forms an image of an object on the imaging surface S8 via the cover glass CG.

The first lens L1 is formed of silicon whose minimum transmittance of infrared rays with a wavelength of 8 μm to 13 μm is at least 40% for a thickness of 1 mm. To satisfy the condition that minimum transmittance of infrared rays with a wavelength of 8 μm to 13 μm is at least 40% for a thickness of 1 mm, the concentration of oxygen contained in silicon should be low (for example, the oxygen concentration should be lower than that of general silicon manufactured by conventional CZ method). Hereinafter, the material of the first lens L1 is referred to as low-oxygen silicon, and a conventional silicon having a relatively high oxygen concentration is referred to as high-oxygen silicon, in order to be distinguished from each other for convenience.

Figure 2:
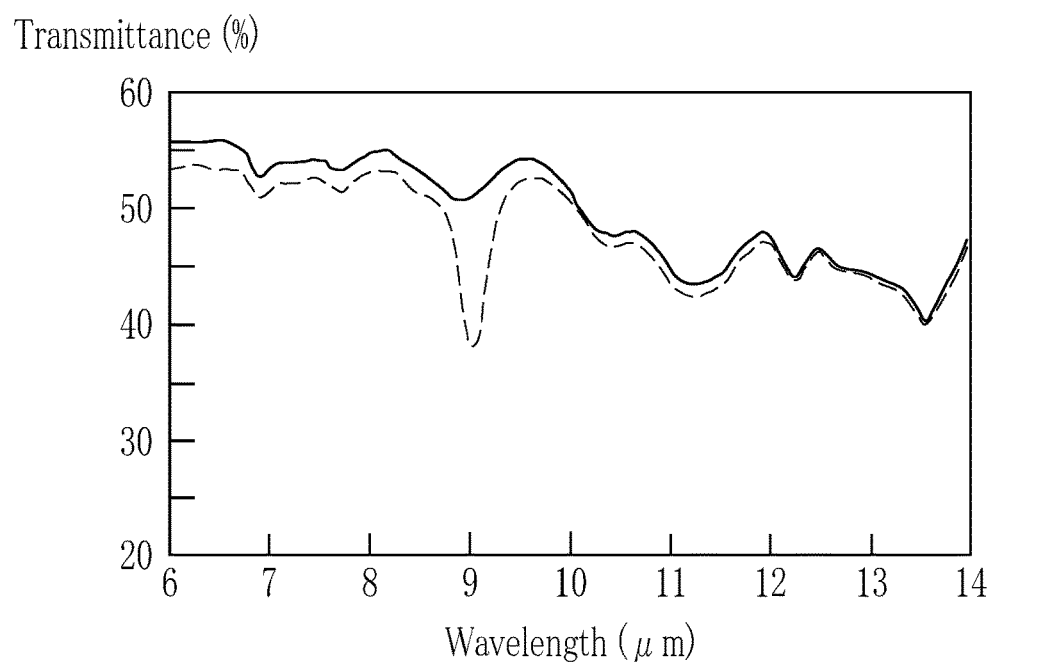
FIG. 2 is a graph illustrating transmittance of infrared rays for silicon of 1 mm thickness.

As indicated by a broken line in FIG. 2, the high-oxygen silicon of 1 mm thickness has significant absorption of infrared rays in the vicinity of 9 μm. Therefore, in the wavelength band of 8 μm to 13 μm, the transmittance of high-oxygen silicon is lowest in the vicinity of 9 μm, and the minimum transmittance is less than 40%. On the other hand, as indicated by a solid line in FIG. 2, the low-oxygen silicon of 1 mm thickness has a lower oxygen concentration than the high-oxygen silicon, so that the transmittance for the infrared rays in the vicinity of 9 μm increases, and the minimum transmittance of infrared rays in the wavelength of 8 μm to 13 μm becomes at least 40%. Although how much infrared absorption (especially absorption of infrared rays in the vicinity of 9 μm) can be suppressed with respect to the high-oxygen silicon depends on the oxygen concentration of the low-oxygen silicon, it is possible to use for the infrared imaging lens system 10 as long as at least the minimum transmittance of infrared rays in the wavelength of 8 μm to 13 μm is at least 40%.

The low-oxygen silicon can be obtained at low cost for example by controlling the oxygen concentration in CZ method. The low-oxygen silicon can be obtained also by the more expensive FZ method, but ordinarily the most inexpensive method is used for manufacturing if the same characteristics can be obtained. Therefore, the low-oxygen silicon is less expensive than conventional infrared materials.

Figure 3:
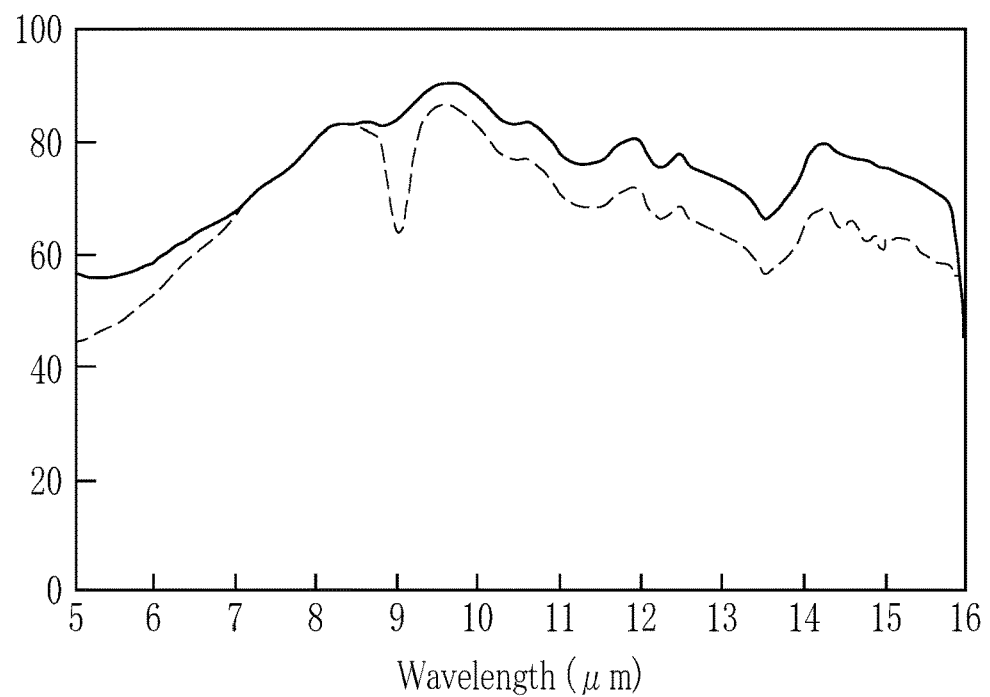
FIG. 3 is a graph illustrating transmittance of infrared rays for silicon of 1 mm thickness with an antireflection coating.

Note that as illustrated in FIG. 3, in cases that the same antireflection coating is applied to the low-oxygen silicon (solid line) and the high-oxygen silicon (broken line) respectively, the transmittance is improved as a whole in the both cases with respect to the transmittance of the infrared ray as each material (see FIG. 2). Accordingly, by applying the antireflection coating, the minimum transmittance of infrared rays in the wavelength of 8 μm to 13 μm can be made at least 40% even with the high-oxygen silicon (broken line). However, the wavelength band in which the transmittance is improved and the degree of improvement in the transmittance depend on the performance of the antireflection coating. In addition, there still remain the characteristics of the material itself, in which the absorption of infrared rays in the vicinity of 9 μm is significant.

Therefore, the condition "minimum transmittance of infrared rays with a wavelength of 8 μm to 13 μm is at least 40%" is the condition only for the characteristics of the material itself of the first lens L1 and does not include the performance of the antireflection coating. However, this does not mean that the antireflection coating should not be applied to the first lens L1 in constructing the infrared imaging lens system 10. Naturally, the first lens L1 is formed with applying the antireflection coating to the low-oxygen silicon. Specifically, in the infrared imaging lens system 10, the antireflection coating is applied to an object side surface S1 and an image side surface S2 of the first lens L1, or one of these surfaces. Therefore, the first lens L1 has for example the transmittance characteristic indicated by the solid line in FIG. 3.

The low-oxygen silicon forming the first lens L1 is a crystal, which is cut out from an ingot or the like and shaped by grinding to keep the state of low oxygen concentration. Accordingly, an aspheric surface formed by heat pressing such as molding is not suitable for the first lens L1, and in the case where the object side surface S1 or the image side surface S2 of the first lens L1 is to be aspherical, it is necessary to form the aspherical surface by grinding. However, in case the aspheric surface is formed by grinding, the cost of the first lens L1 is increased and the infrared imaging lens system 10 cannot be manufactured at low cost. Therefore, in the infrared imaging lens system 10, the first lens L1 is a spherical lens. Concretely, of the first lens L1, the object side surface S1 is spherical, and the image side surface S2 is spherical.

In addition, the first lens L1 also serves as a protection member (for example a cover glass) of the infrared imaging lens system 10. Accordingly, although the infrared imaging lens system 10 is used in harsh environments for example as surveillance cameras and in-vehicle cameras, there is no need to protect the infrared imaging lens system 10 by placing a protective member in front of the first lens L1.

For example, since chalcogenide glass is fragile and has low weather resistance and so on, in the case where a conventional infrared imaging lens in which at least the lens closest to the object side is formed of chalcogenide glass is used, the infrared imaging lens (especially the lens closest to the object side is formed of chalcogenide glass) should be protected by placing a protective member in front of the lens. The protective member is for example a parallel plain plate having no power as a lens. However, since the protective member has to sufficiently transmit infrared rays necessary for imaging, it is necessary to use expensive infrared materials which are good in weather resistance and so on for the protective member as well. The use of expensive materials for the protective member is also one of the reasons for increasing the cost of the conventional infrared imaging lens. On the other hand, in the infrared imaging lens system 10, since the first lens L1 located closest to the object side is made of low-oxygen silicon which is inexpensive and has high weather resistance and so on, it is unnecessary to use an expensive protective member required for a conventional infrared imaging lens. As a result, the infrared imaging lens system 10 can be constructed at a lower cost than a conventional infrared imaging lens.

The second lens L2 is a lens formed of chalcogenide glass. Chalcogenide glass is a glass containing as a main component at least one of a series of elements having similar properties, which are called chalcogen elements, such as sulfur (S), selenium (Se), tellurium (Te), etc. instead of oxygen (O). Chalcogenide glass is relatively inexpensive among various infrared materials. Therefore, since the second lens L2 is formed of chalcogenide glass, the infrared imaging lens system 10 as a whole also becomes inexpensive.

In addition, with chalcogenide glass, an aspheric surface can be easily formed by molding. Accordingly, the second lens L2 of chalcogenide glass is made to be an aspherical lens so as to correct various aberrations in the infrared imaging lens system 10. Thus, even in the case where the first lens L1 is formed of low-oxygen silicon, the required imaging (focusing) performance can be obtained for the infrared imaging lens system 10 as a whole. More concretely, of the second lens L2, an object side surface S4 is aspherical, and an image side surface S5 is aspherical. Since the both surfaces of the second lens L2 are aspherical, even in the case where the first lens L1 is formed of low-oxygen silicon and the both surfaces of the first lens L1 are spherical, good imaging performance can be easily obtained.

Furthermore, the object side surface S4 of the second lens L2 is made to be a diffractive surface, for correcting chromatic aberration. Note that in case a diffractive surface is used, chromatic aberration can be better corrected as the diffractive surface is located closer to the aperture stop S3. Therefore, in the infrared imaging lens system 10, although a diffractive surface can be formed on both of the object side surface S4 and the image side surface S5 of the second lens L2, the object side surface S4 closer to the aperture stop S3 is made to be the diffraction surface.

Other than that, the aperture stop S3 is disposed between the first lens L1 and the second lens L2, the first lens L1 is a meniscus lens convex to the object side, and the second lens L2 is a meniscus lens convex to the image side. This is because it is easy to correct various kinds of aberrations by making the concave and convex arrangement symmetrical with respect to the aperture stop S3 in the two-lens system. With this arrangement, it is possible to favorably correct field curvature which is generated particularly in case the first lens L1 is a spherical lens.

In addition, the infrared imaging lens system 10 satisfies a following formula where f represents a focal length of the entire system, and f1 represents a focal length of the first lens L1:

$$1.1 \le f1/f \le 1.6 \quad \text{(Formula 1)}$$

By satisfying Formula 1, it becomes easy to reduce the field curvature, which tends to be increased because the first lens L1 is the spherical lens formed of low-oxygen silicon. At least it is possible to suppress the field curvature caused by the configuration of the first lens L1 within a range that can be satisfactorily corrected by the aspherical surfaces of the second lens L2.

The infrared imaging lens system 10 satisfies a following formula where D1 represents a center thickness of the first lens L1, and D4 represents a center thickness of the second lens L2:

$$1.6 \le D4/D1 \le 6.0 \quad \text{(Formula 2)}$$

By satisfying Formula 2, it becomes easy to reduce the spherical aberration, which tends to be increased because the first lens L1 is the spherical lens formed of low-oxygen silicon. At least it is possible to suppress the spherical aberration caused by the configuration of the first lens L1 within a range that can be satisfactorily corrected by the aspherical surfaces of the second lens L2.

The infrared imaging lens system 10 satisfies a following formula where R1 represents a curvature radius of the object side surface S1 of the first lens L1, and R2 represents a curvature radius of the image side surface S2 of the first lens L1:

$$1.25 \le R2/R1 \le 1.70 \quad \text{(Formula 3)}$$

By satisfying Formula 3, it becomes easy to reduce the field curvature, which tends to be increased because the first lens L1 is the spherical lens formed of low-oxygen silicon. At least it is possible to suppress the field curvature caused by the configuration of the first lens L1 within a range that can be satisfactorily corrected by the aspherical surfaces of the second lens L2.

The infrared imaging lens system 10 satisfies a following formula where f1 represents a focal length of the first lens L, and $\Delta$ represents a length between the image side surface S2 of the first lens L1 and the object side surface S4 of the second lens L2:

$$2.4 \le f1/\Delta \le 3.2 \quad \text{(Formula 4)}$$

In the case where $f1/\Delta$ is smaller than the lower limit of the Formula 4 ($f1/\Delta < 2.4$), the lens system increases the field curvature caused by the configuration of the first lens L1. In the case where $f1/\Delta$ is larger than the upper limit of the Formula 4 ($3.2 < f1/\Delta$), the lens system increases the spherical aberration caused by the configuration of the first lens L1. Therefore, in the case where $f1/\Delta$ is out of the range of Formula 4, field curvature or spherical aberration cannot be satisfactorily corrected in some cases even with forming the second lens L2 to be an aspheric lens. On the other hand, in the case where $f1/\Delta$ falls within the range of Formula 4, even in the conditions that the first lens L1 is made of low-oxygen silicon and is a spherical lens, both of spherical aberration and field curvature can be easily suppressed at the same time. At least it is possible to suppress the spherical aberration and the field curvature caused by the configuration of the first lens L1 within a range that can be satisfactorily corrected by the aspherical surfaces of the second lens L2.

In the case where the first lens L1 is made of low-oxygen silicon and is a spherical lens like the infrared imaging lens system 10, it is preferable that at least one of Formulas 1 to 4 is satisfied, and especially preferable that all of Formulas 1 to 4 are satisfied.

As described above, the infrared imaging lens system 10 is less expensive than a conventional infrared imaging lens because the first lens L1 is formed of low-oxygen silicon and the second lens L2 is formed of chalcogenide glass. Further, the infrared imaging lens system 10 is inexpensive and has good imaging performance because the both surfaces of the first lens L1 are spherical and the both surfaces of the second lens L2 are aspherical, the concave and convex arrangement of the lens system is symmetrical with respect to the aperture stop S3, and the object side surface S4 of the second lens L2 is a diffractive surface. In addition, by satisfying Formulas 1 to 4, the disadvantages, caused by forming the first lens L1 with low-oxygen silicon and to be a spherical lens for reducing the manufacturing cost, can be improved to obtain good imaging performance.

Examples

Figure 4:
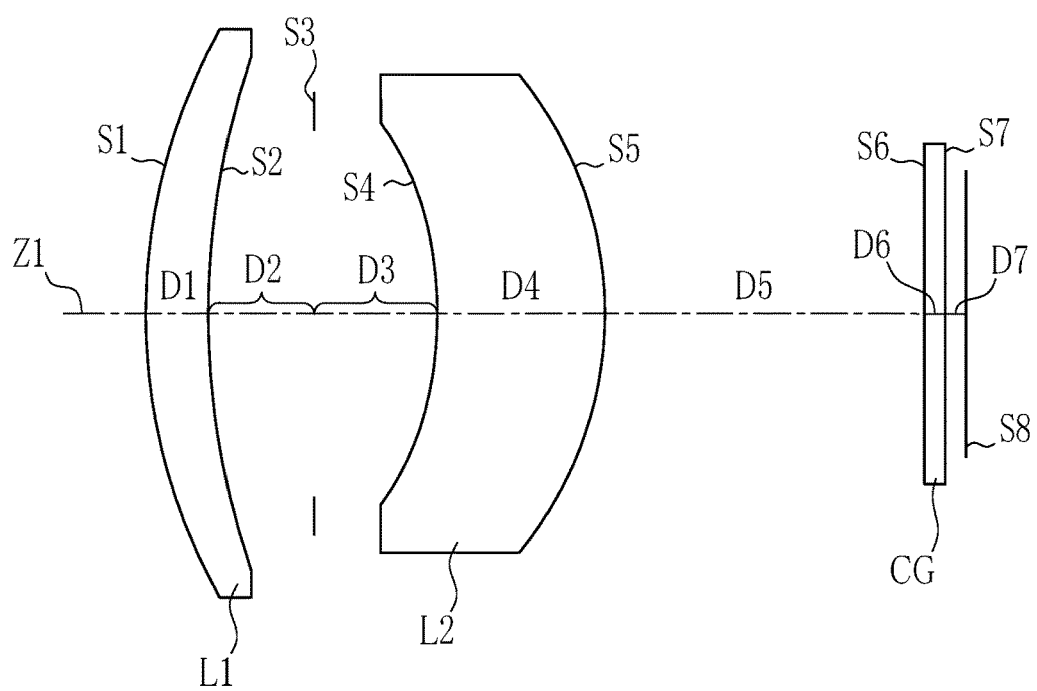
FIG. 4 is a configuration diagram of an infrared imaging lens system of Example 1.
Figure 7:
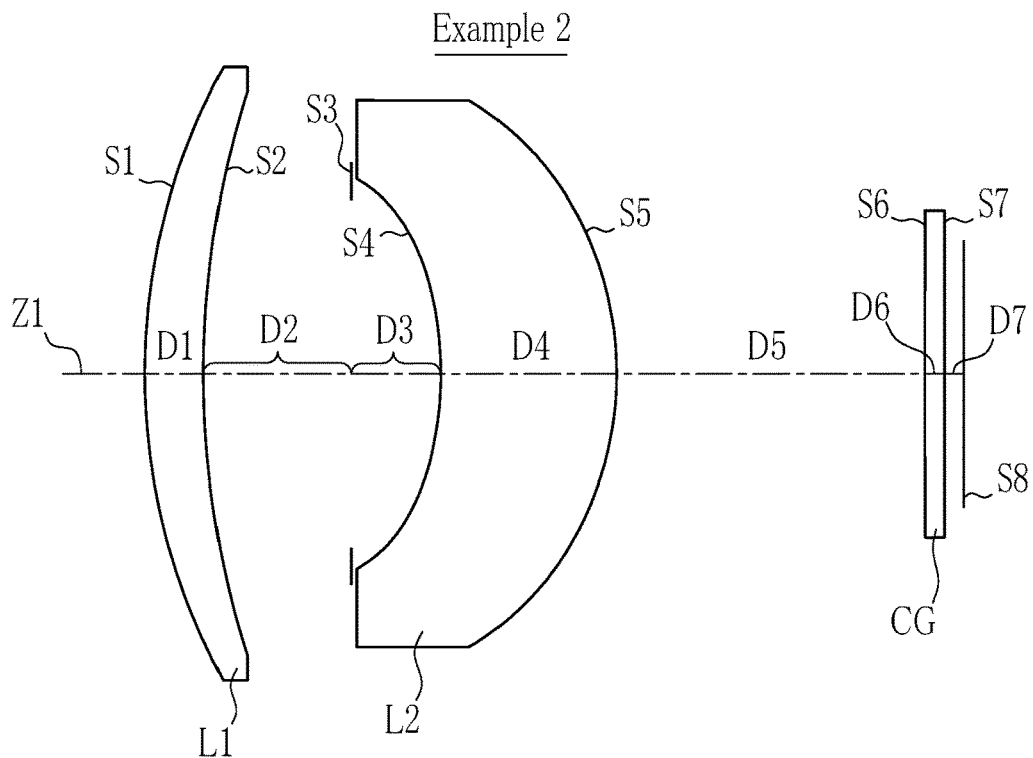
FIG. 7 is a configuration diagram of an infrared imaging lens system of Example 2.
Figure 8A:
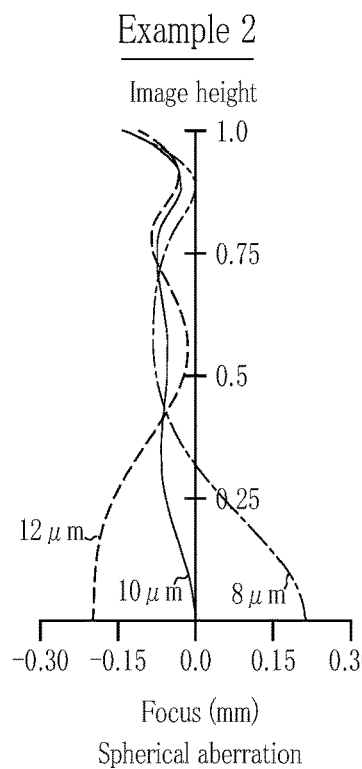
FIG. 8A is a graph which illustrates spherical aberration in Example 2.
Figure 8B:
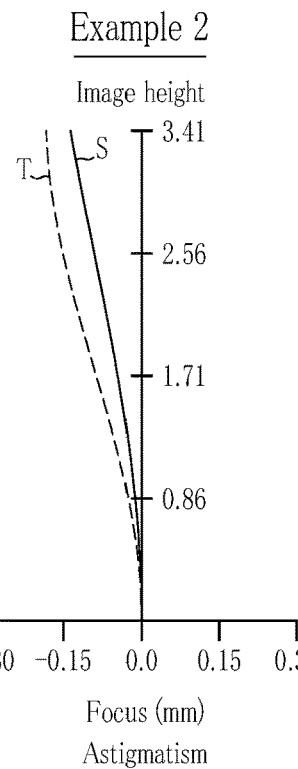
FIG. 8B is a graph which illustrates astigmatism in Example 2.
Figure 8C:
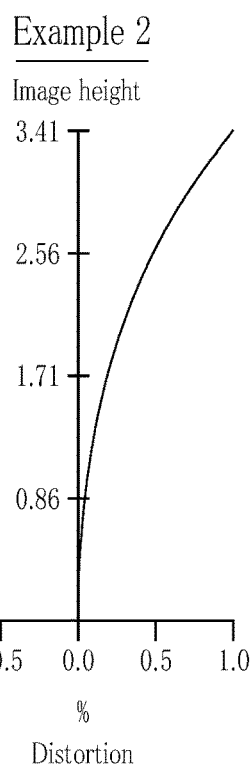
FIG. 8C is a graph which illustrates distortion in Example 2.
Figure 9:
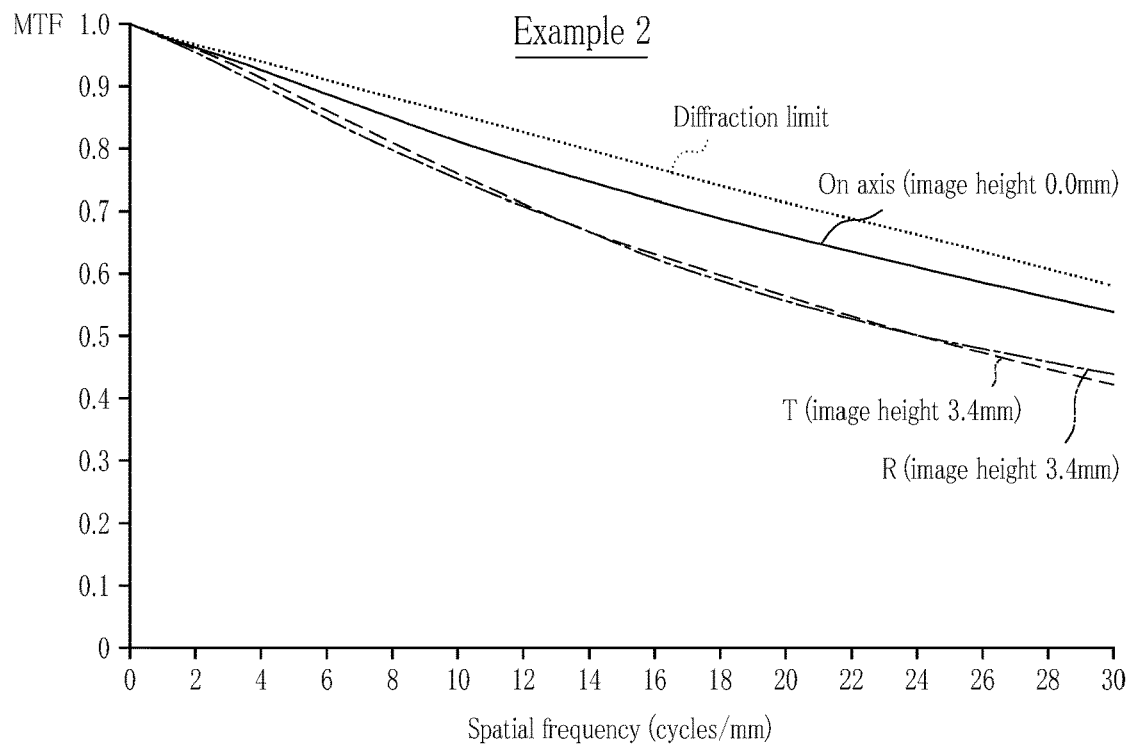
FIG. 9 is a graph illustrating MTF for spatial frequency in Example 2.
Figure 10:
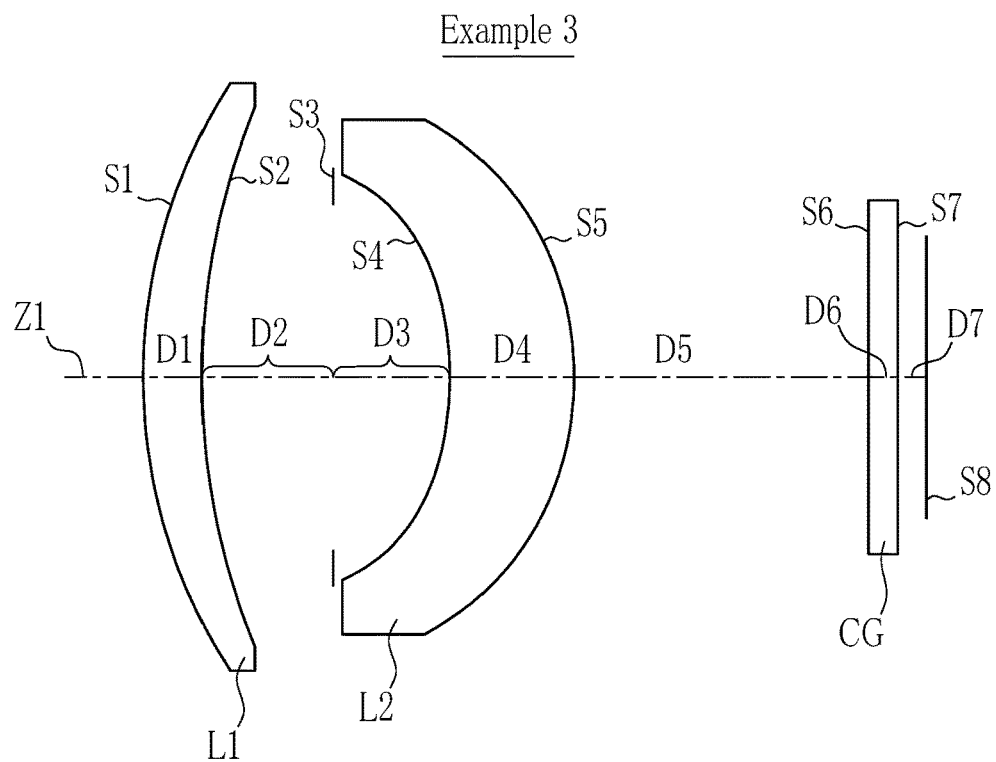
FIG. 10 is a configuration diagram of an infrared imaging lens system of Example 3.
Figure 11A:
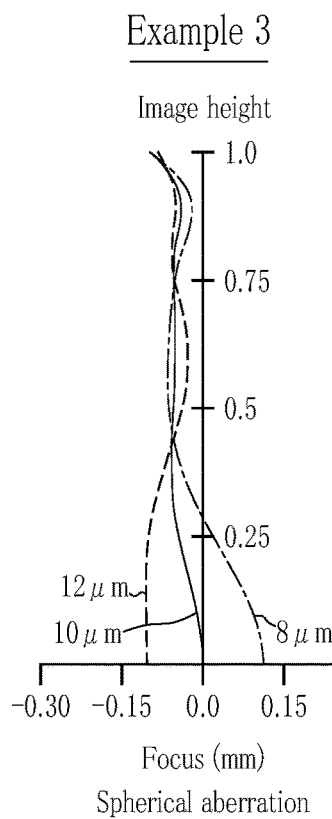
FIG. 11A is a graph which illustrates spherical aberration in Example 3.
Figure 11B:
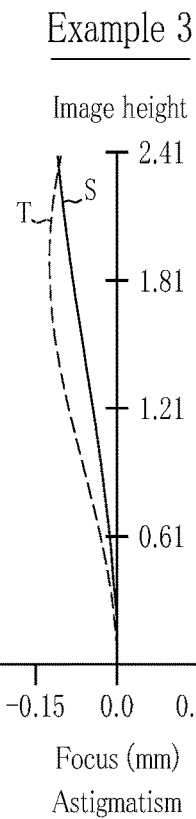
FIG. 11B is a graph which illustrates astigmatism in Example 3.
Figure 11C:
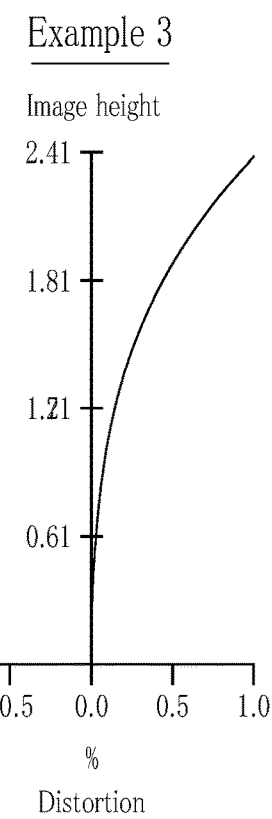
FIG. 11C is a graph which illustrates distortion in Example 3.
Figure 12:
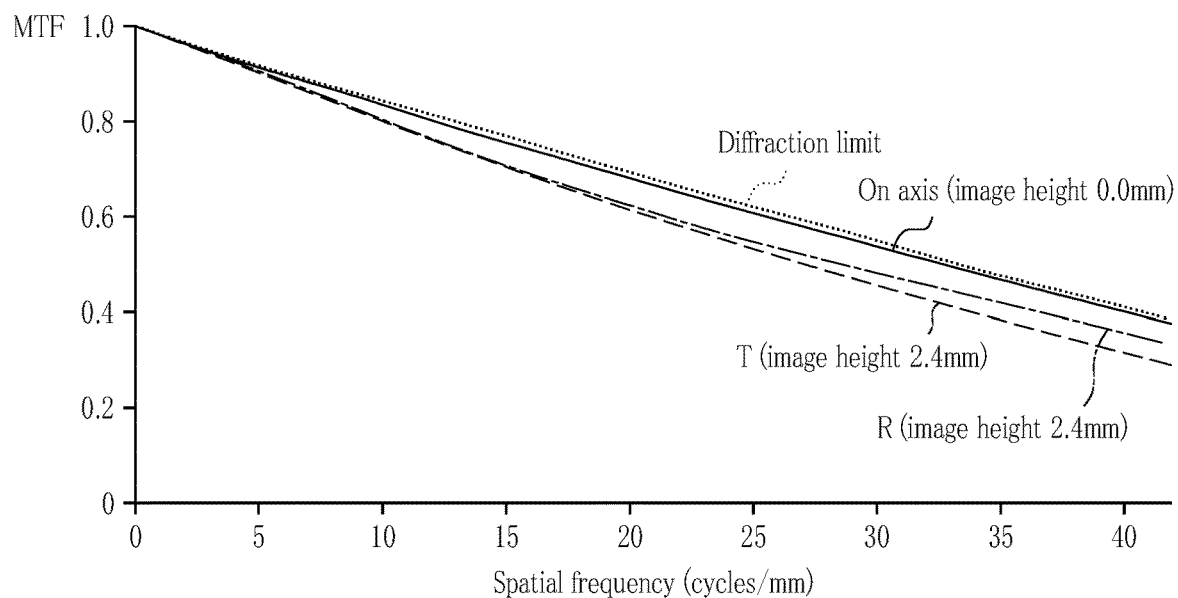
FIG. 12 is a graph illustrating MTF for spatial frequency in Example 3.
Figure 13:
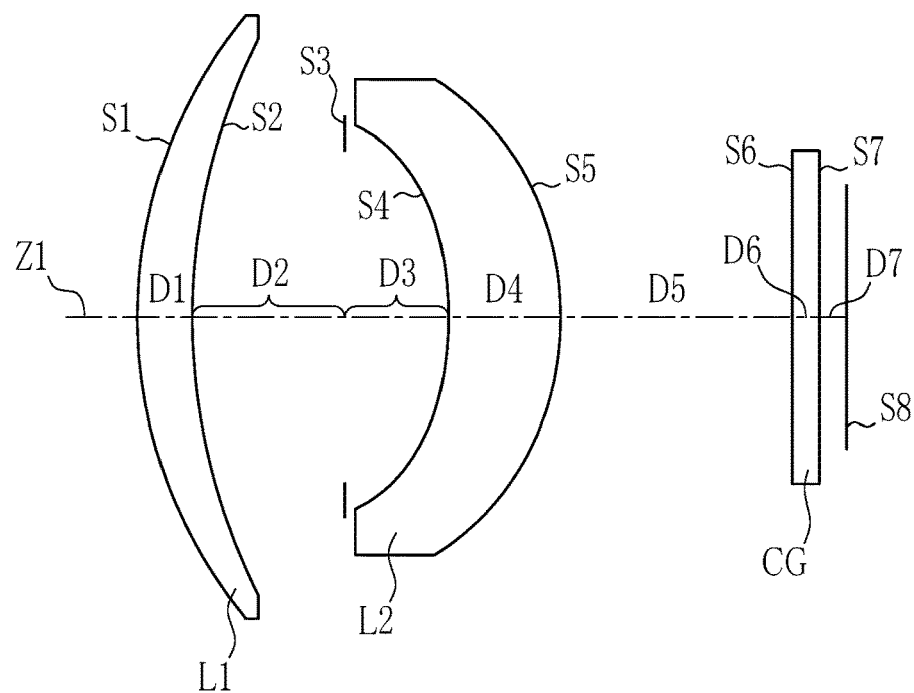
FIG. 13 is a configuration diagram of an infrared imaging lens system of Example 4.
Figure 14A:
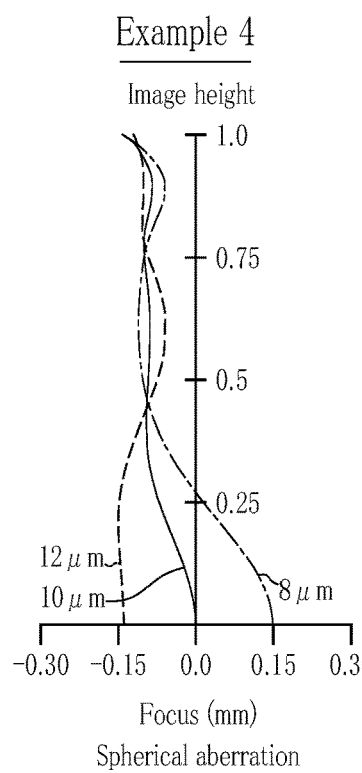
FIG. 14A is a graph which illustrates spherical aberration in Example 4.
Figure 14B:
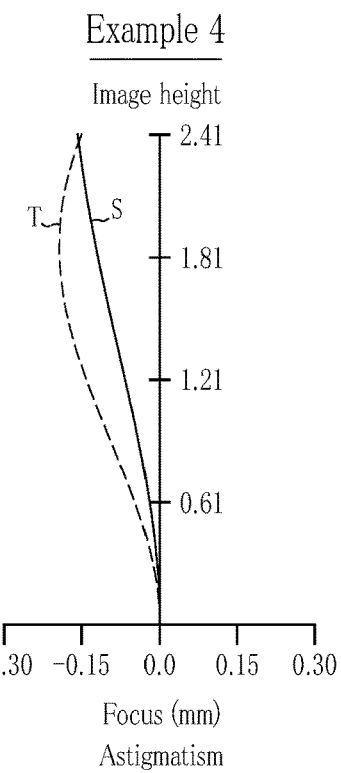
FIG. 14B is a graph which illustrates astigmatism in Example 4.
Figure 14C:
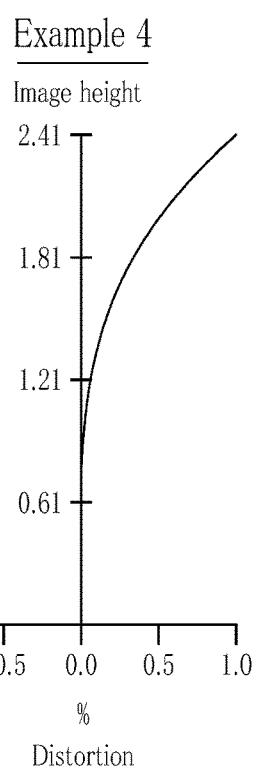
FIG. 14C is a graph which illustrates distortion in Example 4.
Figure 15:
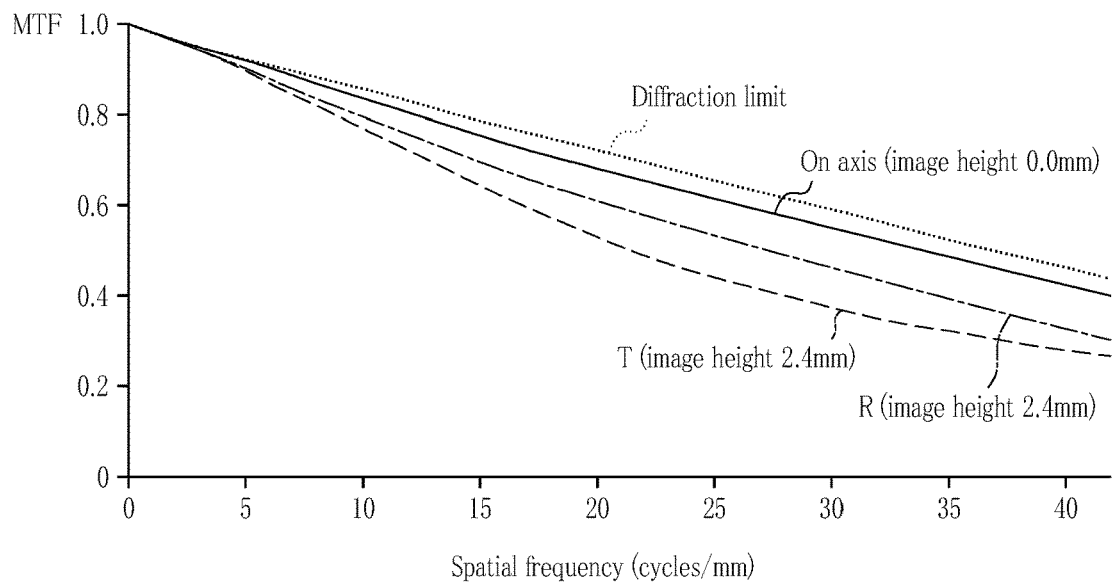
FIG. 15 is a graph illustrating MTF for spatial frequency in Example 4.
Figure 16:
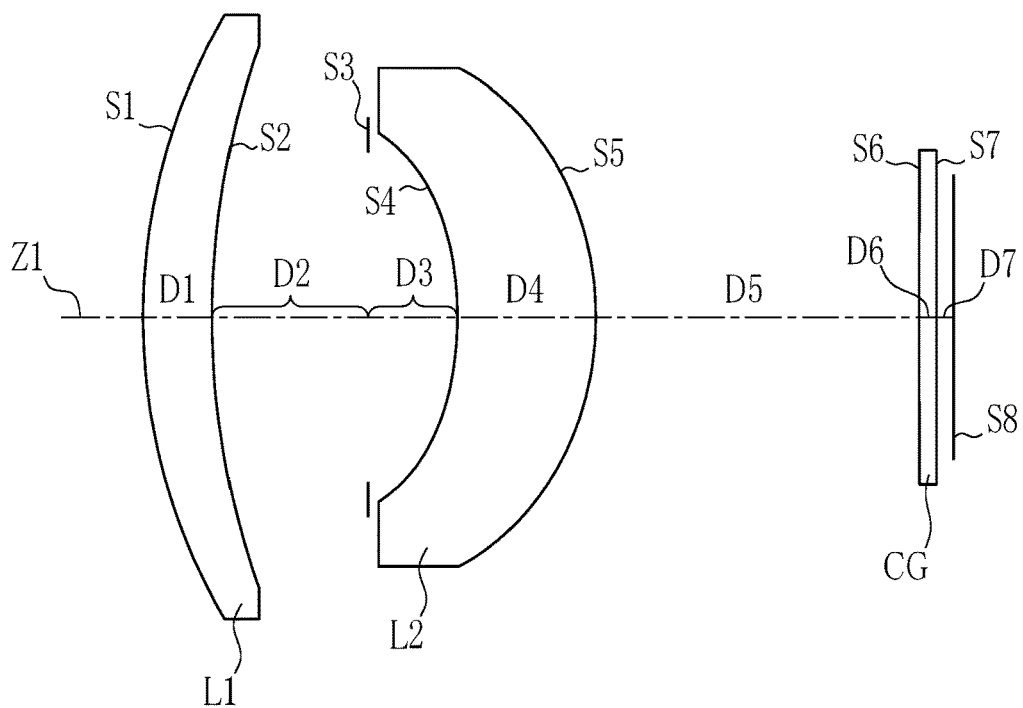
FIG. 16 is a configuration diagram of an infrared imaging lens system of Example 5.
Figure 17A:
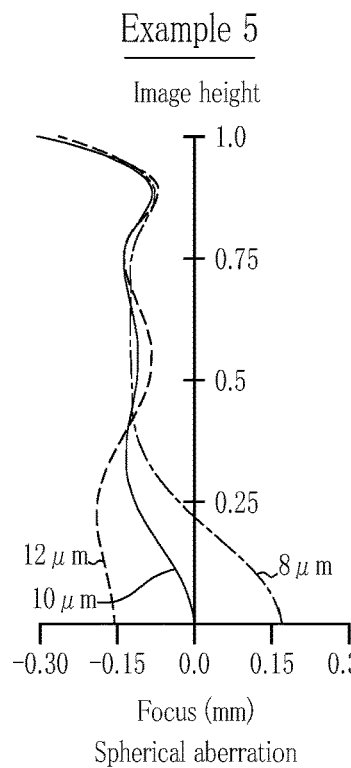
FIG. 17A is a graph which illustrates spherical aberration in Example 5.
Figure 17B:
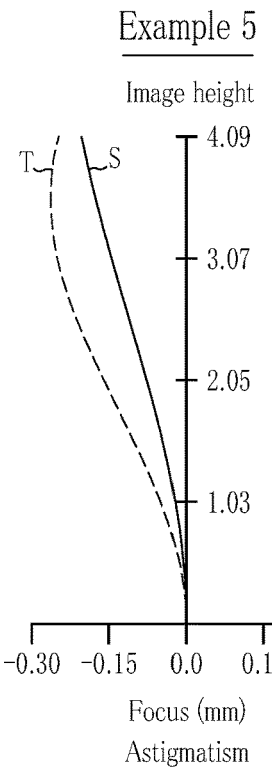
FIG. 17B is a graph which illustrates astigmatism in Example 5.
Figure 17C:
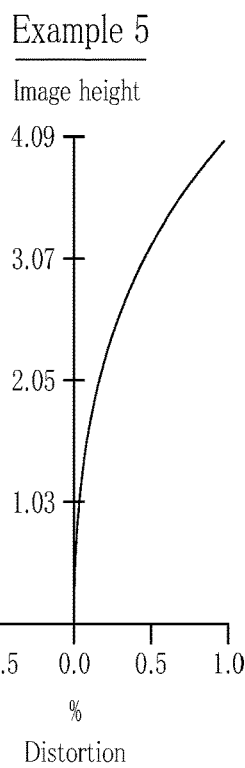
FIG. 17C is a graph which illustrates distortion in Example 5.
Figure 18:
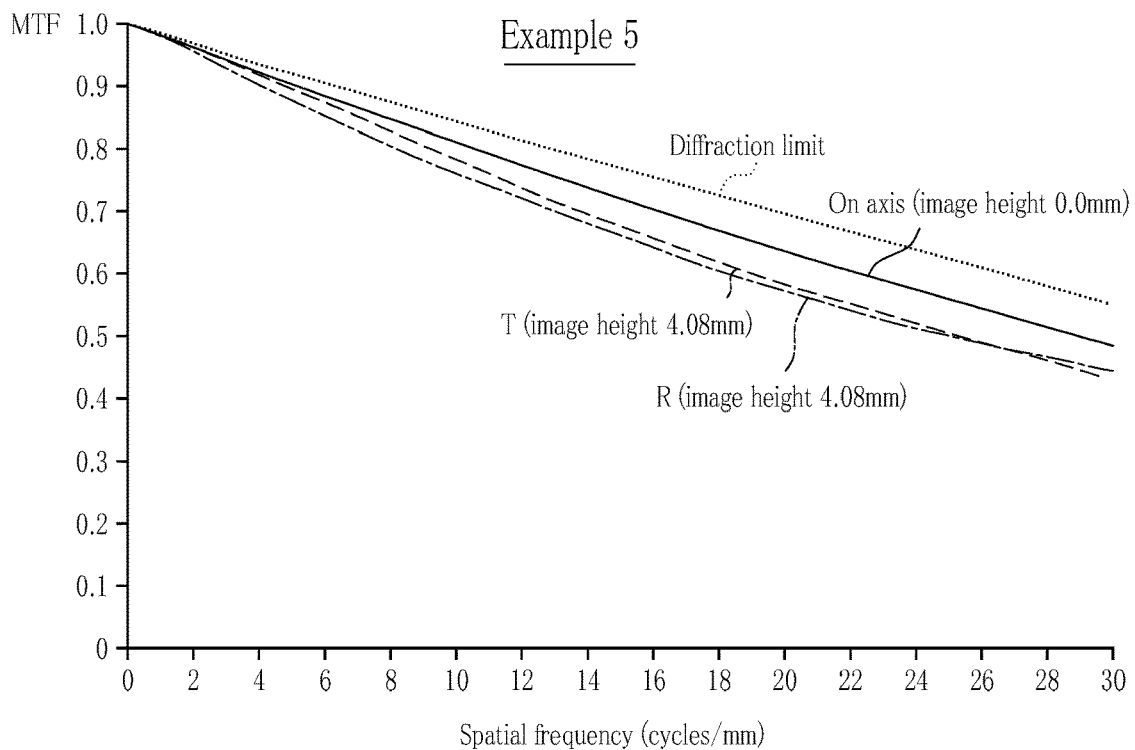
FIG. 18 is a graph illustrating MTF for spatial frequency in Example 5.
Figure 21:
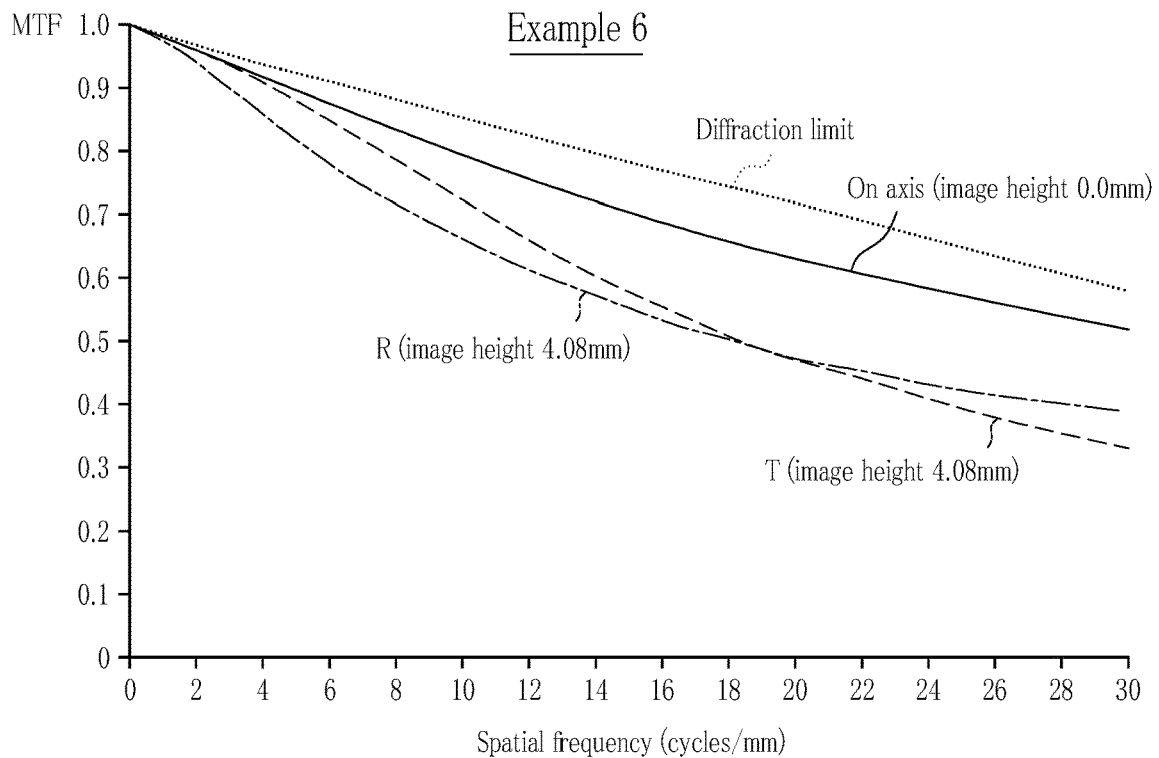
FIG. 21 is a graph illustrating MTF for spatial frequency in Example 6.
Figure 22:
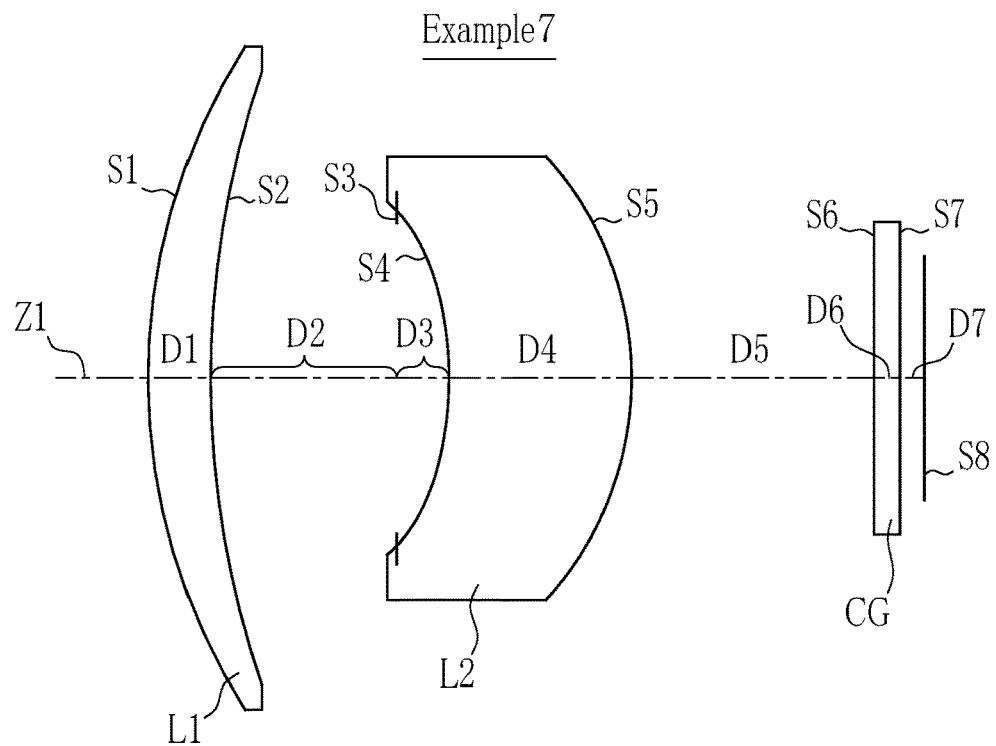
FIG. 22 is a configuration diagram of an infrared imaging lens system of Example 7.
Figure 23A:
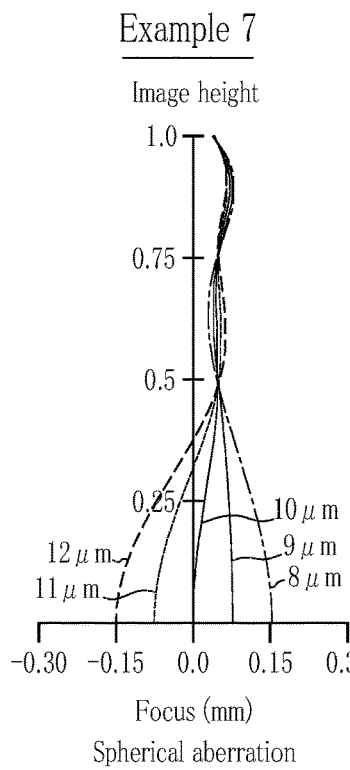
FIG. 23A is a graph which illustrates spherical aberration in Example 7.
Figure 23B:
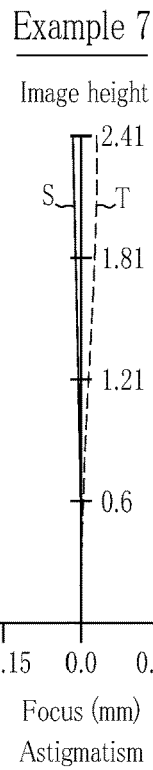
FIG. 23B is a graph which illustrates astigmatism in Example 7.
Figure 23C:
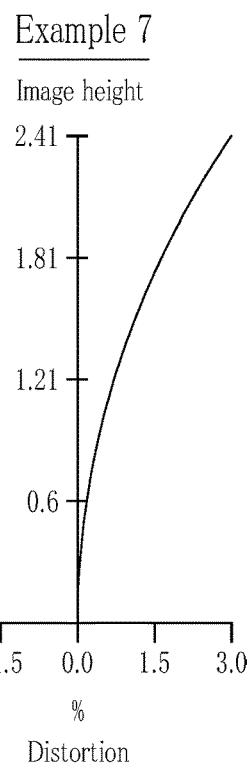
FIG. 23C is a graph which illustrates distortion in Example 7.
Figure 24:
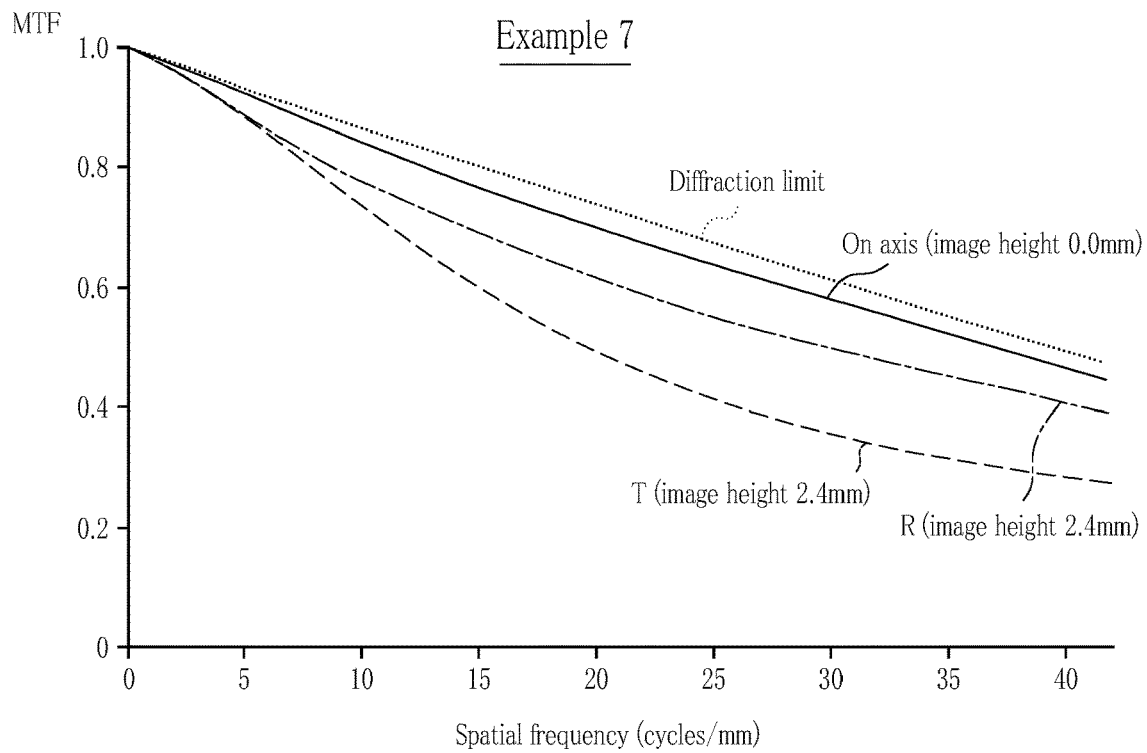
FIG. 24 is a graph illustrating MTF for spatial frequency in Example 7.
Figure 25:
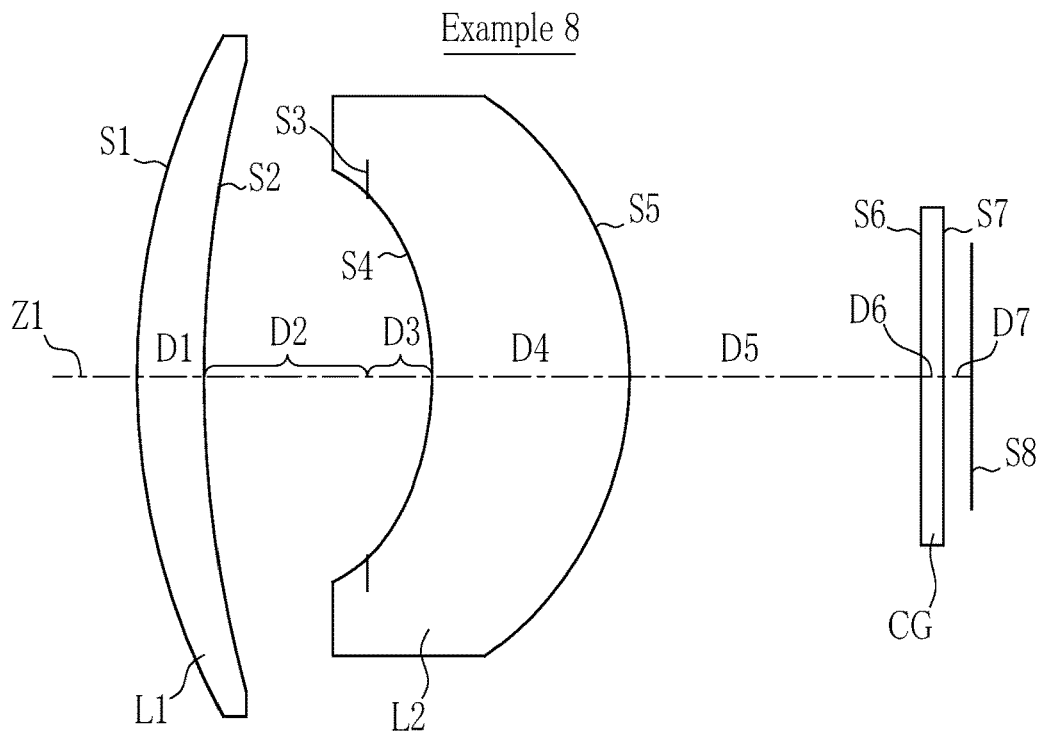
FIG. 25 is a configuration diagram of an infrared imaging lens system of Example 8.
Figure 26A:
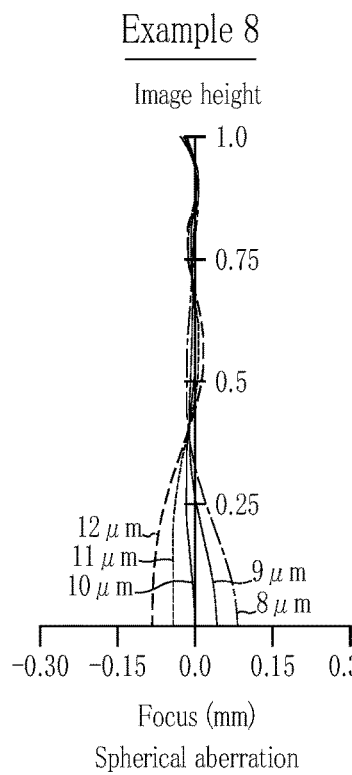
FIG. 26A is a graph which illustrates spherical aberration in Example 8.
Figure 26B:
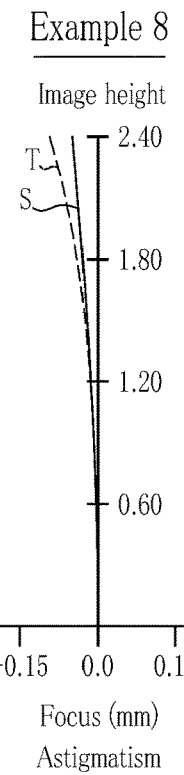
FIG. 26B is a graph which illustrates astigmatism in Example 8.
Figure 26C:
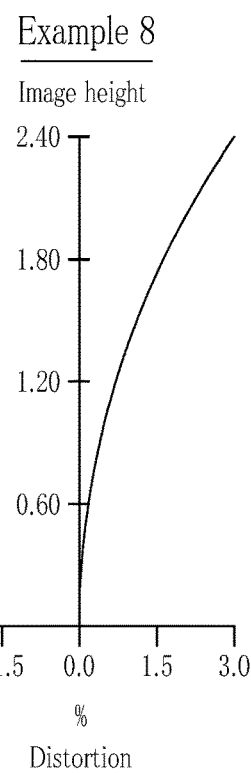
FIG. 26C is a graph which illustrates distortion in Example 8.

Examples of the infrared imaging lens system 10 will be described below. FIG. 4 shows a configuration diagram of the infrared imaging lens system 10 of Example 1. Each surface number is indicated by Si (i=1 to 8) in order from the object side surface S1 of the first lens L1. S3 is the aperture stop, S6 is the object side surface of the cover glass CG, S7 is the image side surface of the cover glass CG, and S8 is the imaging surface of the image sensor 11. Each distance (center thickness or air gap) is indicated by Di (i=1 to 7, unit mm) which is the distance between the surface Si and the surface Si+1.

Lens data of Example 1 is shown in Tables 1 to 3 below. Table 1 shows the surface number i of each surface Si, the curvature radius Ri (i=1 to 8, unit mm) of each surface Si, the distance Di, the refractive index ni (i=1 to 7) for infrared rays with a wavelength of 10 μm, and the materials of the first lens L1 and the second lens L2 of the infrared imaging lens system 10 of Example 1. In addition, the "*" mark attached to the surface number Si indicates that it is an aspherical surface, and the "#" mark attached to the surface number Si indicates that it is a diffractive surface. All surfaces with no "*" and "#" marks are spherical.

TABLE 1

Example 1 Basic lens data

| Si | Ri | Di | ni (10 μm) | Material |
|---|---|---|---|---|
| 1 | 13.681 | 1.50 | 3.4179 | Low-oxygen silicon |
| 2 | 18.840 | 2.52 | 1.0000 | |
| 3 (Stop) | ∞ | 2.95 | 1.0000 | |
| 4*# | −8.931 | 4.00 | 2.4944 | Chalcogenide glass |
| 5* | −8.801 | 7.64 | 1.0000 | |
| 6 (CG) | ∞ | 0.50 | 3.4179 | Low-oxygen silicon |
| 7 (CG) | ∞ | 0.50 | 1.0000 | |
| 8 (Imaging surface) | ∞ | 0.00 | 1.0000 | |

The aspheric surface is represented by a following aspheric expression of Equation 1. In the following aspheric expression of Equation 1, "Z" is the depth (mm) of the aspheric surface, "h" is the height from the optical axis (the distance from the optical axis to the lens surface) (mm), "C" is the paraxial curvature (that is, in the case where the paraxial curvature radius is R (mm), C=1/R), "K" is the conic constant, and "Ai" is the aspherical coefficient. In Table 2, "K" and "Ai" of each aspherical surface (see "*" mark in Table 1) of Example 1 are shown.

$$Z = \frac{Ch^2}{1 + \sqrt{1-(K+1)(Ch)^2}} + \sum A_i h^i \qquad \text{[Equation 1]}$$

TABLE 2

Example 1 Aspherical data

| Aspherical coefficient | S4 | S5 |
|---|---|---|
| K | −2.58478E+01 | 0.00000E+00 |
| A4 | −2.49410E−03 | 4.72399E−06 |
| A6 | 2.26339E−05 | −2.43728E−07 |
| A8 | 2.18650E−06 | 2.21796E−08 |
| A10 | −7.50898E−08 | 0.00000E+00 |

The diffractive surface is represented by the optical path difference function φ in Equation 2 below. The optical path difference function φ indicates an addition amount of an optical path length difference by the diffractive surface in correlation with a distance from the optical axis, where "r" is the distance (mm) from the optical axis and "Cn" (n=1 to 10) is the diffractive surface coefficient. Table 3 shows each diffractive surface coefficient Cn of the diffractive surface of Example 1 (see "#" mark in Table 1).

$$\phi = \sum_{n=1}^{10} C_n r^{2n} \qquad \text{[Equation 2]}$$

TABLE 3

Example 1 Diffractive surface data

| Diffractive surface coefficient | S4 |
|---|---|
| C1 | −7.95838E−03 |
| C2 | 2.81755E−03 |
| C3 | −4.70843E−04 |
| C4 | 3.70198E−05 |
| C5 | −1.37553E−06 |
| C6 | 1.94930E−08 |

FIG. 5A illustrates spherical aberration for each infrared rays having a wavelength of 8 μm, a wavelength of 10 μm, and a wavelength of 12 μm in Example 1. FIG. 5B illustrates astigmatism S in the sagittal (radial) direction and astigmatism T in the tangential (meridional) direction for infrared rays having a wavelength of 10 μm in Example 1. FIG. 5C illustrates the distortion for infrared rays having a wavelength of 10 μm in Example 1. Since the infrared imaging lens system 10 of Example 1 is a lens used for the image sensor 11 of QVGA (320×240 pixels) with 17 μm pitch, the maximum image height is 3.41 mm.

FIG. 6 illustrates the MTF (Modulation Transfer Function) on the axis (image height 0.0 mm), and the MTF in the tangential direction (T) and the MTF in the radial direction (R) at the image height of 3.4 mm, for spatial frequency regarding the infrared imaging lens system 10 of Example 1.

As same as in Example 1, a configuration diagram, various lens data, various aberrations, and MTF of the infrared imaging lens system 10 of each of Examples 2 to 8 are shown in FIGS. 7 to 27 and Tables 4 to 24. Since the infrared imaging lens system 10 of Example 2 is a lens used for the image sensor 11 of QVGA (320×240 pixels) with 17 μm pitch, the maximum image height is 3.41 mm. Since the infrared imaging lens system 10 of Examples 3 and 4 is a lens used for the image sensor 11 of QVGA (320×240 pixels) with 12 μm pitch, the maximum image height is 2.41 mm. Since the infrared imaging lens system 10 of Examples 5 and 6 is a lens used for the image sensor 11 of QVGA (384×288 pixels) with 17 μm pitch, the maximum image height is 4.09 mm. Since the infrared imaging lens system 10 of Example 7 is a lens used for the image sensor 11 of QVGA (320×240 pixels) with 12 μm pitch, the maximum image height is 2.41 mm. Since the infrared imaging lens system 10 of Example 8 is a lens used for the image sensor 11 of QVGA (320×240 pixels) with 12 μm pitch, the maximum image height is 2.40 mm.

TABLE 4

Example 2 Basic lens data

| Si | Ri | Di | ni (10 μm) | Material |
|---|---|---|---|---|
| 1 | 16.134 | 1.50 | 3.4179 | Low-oxygen silicon |
| 2 | 23.493 | 3.79 | 1.0000 | |
| 3 (Stop) | ∞ | 2.30 | 1.0000 | |
| 4*# | −8.807 | 4.50 | 2.4944 | Chalcogenide glass |
| 5* | −8.691 | 7.90 | 1.0000 | |
| 6 (CG) | ∞ | 0.50 | 3.4179 | Low-oxygen silicon |
| 7 (CG) | ∞ | 0.50 | 1.0000 | |
| 8 (Imaging surface) | ∞ | 0.00 | 1.0000 | |

TABLE 5

Example 2 Aspherical data

| Aspherical coefficient | S4 | S5 |
|---|---|---|
| K | −2.05097E+01 | 0.00000E+00 |
| A4 | −1.94988E−03 | −5.54501E−05 |
| A6 | −4.93633E−05 | 1.85909E−06 |
| A8 | 5.30208E−06 | −7.06053E−08 |
| A10 | −1.59092E−07 | 0.00000E+00 |

TABLE 6

Example 2 Diffractive surface data

| Diffractive surface coefficient | S4 |
|---|---|
| C1 | −9.58251E−03 |
| C2 | 3.06581E−03 |
| C3 | −4.56480E−04 |
| C4 | 3.18989E−05 |
| C5 | −1.04978E−06 |
| C6 | 1.30182E−08 |

TABLE 7

Example 3 Basic lens data

| Si | Ri | Di | ni (10 μm) | Material |
|---|---|---|---|---|
| 1 | 9.130 | 1.00 | 3.4179 | Low-oxygen silicon |
| 2 | 12.057 | 2.26 | 1.0000 | |
| 3 (Stop) | ∞ | 2.00 | 1.0000 | |
| 4*# | −5.486 | 2.13 | 2.4944 | Chalcogenide glass |
| 5* | −5.402 | 5.05 | 1.0000 | |
| 6 (CG) | ∞ | 0.50 | 3.4179 | Low-oxygen silicon |
| 7 (CG) | ∞ | 0.50 | 1.0000 | |
| 8 (Imaging surface) | ∞ | 0.00 | 1.0000 | |

TABLE 8

Example 3 Aspherical data

| Aspherical coefficient | S4 | S5 |
|---|---|---|
| K | −1.78998E+01 | 0.00000E+00 |
| A4 | −9.01142E−03 | −5.26071E−04 |
| A6 | 4.48387E−05 | 1.52490E−05 |
| A8 | 3.74620E−05 | −1.76022E−06 |
| A10 | −3.44373E−06 | 0.00000E+00 |

TABLE 9

Example 3 Diffractive surface data

| Diffractive surface coefficient | S4 |
|---|---|
| C1 | −1.14430E−02 |
| C2 | 8.39651E−03 |
| C3 | −2.92733E−03 |

TABLE 9-continued

Example 3 Diffractive surface data

| Diffractive surface coefficient | S4 |
|---|---|
| C4 | 4.77092E−04 |
| C5 | −3.65294E−05 |
| C6 | 1.05726E−06 |

TABLE 10

Example 4 Basic lens data

| Si | Ri | Di | ni (10 μm) | Material |
|---|---|---|---|---|
| 1 | 8.579 | 1.00 | 3.4179 | Low-oxygen silicon |
| 2 | 11.153 | 2.80 | 1.0000 | |
| 3 (Stop) | ∞ | 1.90 | 1.0000 | |
| 4*# | −5.861 | 2.05 | 2.4944 | Chalcogenide glass |
| 5* | −5.753 | 4.25 | 1.0000 | |
| 6 (CG) | ∞ | 0.50 | 3.4179 | Low-oxygen silicon |
| 7 (CG) | ∞ | 0.50 | 1.0000 | |
| 8 (Imaging surface) | ∞ | 0.00 | 1.0000 | |

TABLE 11

Example 4 Aspherical data

| Aspherical coefficient | S4 | S5 |
|---|---|---|
| K | −2.64256E+01 | 0.00000E+00 |
| A4 | −7.47745E−03 | −8.52789E−04 |
| A6 | −4.23645E−04 | 2.09415E−05 |
| A8 | 9.71478E−05 | −1.42732E−06 |
| A10 | −5.47625E−06 | 0.00000E+00 |

TABLE 12

Example 4 Diffractive surface data

| Diffractive surface coefficient | S4 |
|---|---|
| C1 | −1.76468E−02 |
| C2 | 1.32574E−02 |
| C3 | −4.46646E−03 |
| C4 | 7.05428E−04 |
| C5 | −5.23083E−05 |
| C6 | 1.46484E−06 |

TABLE 13

Example 5 Basic lens data

| Si | Ri | Di | ni (10 μm) | Material |
|---|---|---|---|---|
| 1 | 17.116 | 2.00 | 3.4179 | Low-oxygen silicon |
| 2 | 23.117 | 4.52 | 1.0000 | |
| 3 (Stop) | ∞ | 2.59 | 1.0000 | |
| 4*# | −9.367 | 4.00 | 2.4944 | Chalcogenide glass |
| 5* | −9.18 | 9.37 | 1.0000 | |

TABLE 13-continued

Example 5 Basic lens data

| Si | Ri | Di | ni (10 μm) | Material |
|---|---|---|---|---|
| 6 (CG) | ∞ | 0.50 | 3.4179 | Low-oxygen silicon |
| 7 (CG) | ∞ | 0.50 | 1.0000 | |
| 8 (Imaging surface) | ∞ | 0.00 | 1.0000 | |

TABLE 14

Example 5 Aspherical data

| Aspherical coefficient | S4 | S5 |
|---|---|---|
| K | −2.34626E+01 | 4.49720E−01 |
| A4 | −2.52433E−03 | −1.57857E−05 |
| A6 | 6.59267E−05 | 2.96030E−06 |
| A8 | −1.57121E−06 | −9.67430E−08 |
| A10 | 0.00000E+00 | 1.45780E−09 |

TABLE 15

Example 5 Diffractive surface data

| Diffractive surface coefficient | S4 |
|---|---|
| C1 | −5.86430E−03 |
| C2 | 1.63156E−03 |
| C3 | −2.38303E−04 |
| C4 | 1.69548E−05 |
| C5 | −5.82848E−07 |
| C6 | 7.72279E−09 |

TABLE 16

Example 6 Basic lens data

| Si | Ri | Di | ni (10 μm) | Material |
|---|---|---|---|---|
| 1 | 18.103 | 2.00 | 3.4179 | Low-oxygen silicon |
| 2 | 25.727 | 3.21 | 1.0000 | |
| 3 (Stop) | ∞ | 3.55 | 1.0000 | |
| 4*# | −10.121 | 5.00 | 2.4944 | Chalcogenide glass |
| 5* | −10.121 | 9.55 | 1.0000 | |
| 6 (CG) | ∞ | 0.50 | 3.4179 | Low-oxygen silicon |
| 7 (CG) | ∞ | 0.50 | 1.0000 | |
| 8 (Imaging surface) | ∞ | 0.00 | 1.0000 | |

TABLE 17

Example 6 Aspherical data

| Aspherical coefficient | S4 | S5 |
|---|---|---|
| K | −2.22476E+01 | 2.77830E−01 |
| A4 | −1.67973E−03 | 2.45491E−05 |
| A6 | 3.04303E−05 | 1.29380E−06 |
| A8 | −5.26921E−07 | −3.82061E−08 |
| A10 | 0.00000E+00 | 4.70490E−10 |

TABLE 18

Example 6 Diffractive surface data

| Diffractive surface coefficient | S4 |
|---|---|
| C1 | −6.91708E−03 |
| C2 | 1.39905E−03 |
| C3 | −1.45089E−04 |
| C4 | 7.40636E−06 |
| C5 | −1.83701E−07 |
| C6 | 1.76263E−09 |

TABLE 19

Example 7 Basic lens data

| Si | Ri | Di | ni (10 μm) | Material |
|---|---|---|---|---|
| 1 | 11.653 | 1.20 | 3.4179 | Low-oxygen silicon |
| 2 | 17.924 | 3.58 | 1.0000 | |
| 3 (Stop) | ∞ | 1.00 | 1.0000 | |
| 4*# | −6.325 | 3.50 | 2.4944 | Chalcogenide glass |
| 5* | −6.197 | 4.65 | 1.0000 | |
| 6 (CG) | ∞ | 0.50 | 3.4179 | Low-oxygen silicon |
| 7 (CG) | ∞ | 0.48 | 1.0000 | |
| 8 (Imaging surface) | ∞ | 0.00 | 1.0000 | |

TABLE 20

Example 7 Aspherical data

| Aspherical coefficient | S4 | S5 |
|---|---|---|
| K | −1.27604E+01 | 0.00000E+00 |
| A4 | −1.53521E−03 | 1.92610E−04 |
| A6 | −8.86939E−04 | −5.95586E−06 |
| A8 | 1.09120E−04 | −8.12374E−08 |
| A10 | −4.93634E−06 | 0.00000E+00 |

TABLE 21

Example 7 Diffractive surface data

| Diffractive surface coefficient | S4 |
|---|---|
| C1 | −1.66227E−02 |
| C2 | 9.84026E−03 |
| C3 | −2.67378E−03 |
| C4 | 3.49866E−04 |
| C5 | −2.16280E−05 |
| C6 | 4.93171E−07 |

TABLE 22

Example 8 Basic lens data

| Si | Ri | Di | ni (10 μm) | Material |
|---|---|---|---|---|
| 1 | 12.492 | 1.20 | 3.4179 | Low-oxygen silicon |
| 2 | 21.236 | 2.89 | 1.0000 | |
| 3 (Stop) | ∞ | 1.15 | 1.0000 | |
| 4*# | −5.659 | 3.50 | 2.4944 | Chalcogenide glass |
| 5* | −5.816 | 5.17 | 1.0000 | |

TABLE 22-continued

Example 8 Basic lens data

| Si | Ri | Di | ni (10 μm) | Material |
|---|---|---|---|---|
| 6 (CG) | ∞ | 0.40 | 3.4179 | Low-oxygen silicon |
| 7 (CG) | ∞ | 0.50 | 1.0000 | |
| 8 (Imaging surface) | ∞ | 0.00 | 1.0000 | |

TABLE 23

Example 8 Aspherical data

| Aspherical coefficient | S4 | S5 |
|---|---|---|
| K | −1.43459E+01 | 0.00000E+00 |
| A4 | −6.54143E−03 | 3.04916E−04 |
| A6 | 3.16584E−05 | 2.63181E−06 |
| A8 | 2.85649E−05 | −1.72230E−07 |
| A10 | −2.30191E−06 | 0.00000E+00 |

TABLE 24

Example 8 Diffractive surface data

| Diffractive surface coefficient | S4 |
|---|---|
| C1 | −8.67049E−03 |
| C2 | 5.91157E−03 |
| C3 | −1.81497E−03 |
| C4 | 2.63782E−04 |
| C5 | −1.84080E−05 |
| C6 | 4.95026E−07 |

Tables 25 and 26 below show other performances such as F value (FNo) and so on, parameters not included in the above-listed lens data among the parameters for calculating respective values of Formulas 1 to 4, and the respective values of Formulas 1 to 4 in the above-described Examples 1 to 8. "f" is the focal length of the whole system of the infrared imaging lens system 10, "f1" is the focal length of the first lens L1, "D1" (the distance between S1 and S2) is the center thickness of the first lens L1, and "D4" (the distance between S4 and S5) is the center thickness of the second lens L2. "Δ" is the distance between the image side surface S2 of the first lens L1 and the object side surface S4 of the second lens L2, that is, the sum of the distance D2 and the distance D3 in the above-listed lens data. MTF is the MTF at the resolution (LP/mm (Line Pairs per millimeter)) shown in each column. As can be seen from Tables 25 and 26, each of the infrared imaging lens system 10 of Examples 1 to 8 satisfies Formulas 1 to 4. Also, as can be seen from Table 25 and Table 26 and the graphs of the aberrations and the MTF of the above examples, although the first lens L1 is formed of low-oxygen silicon and the both surfaces of the first lens L1 are spherical, good imaging performance is obtained in each of Examples 1 to 8.

TABLE 25

| | Example 1 | Example 2 | Example 3 | Example 4 |
|---|---|---|---|---|
| FNo | 1.2 | 1.1 | 1.2 | 1.1 |
| f (mm) | 12.75 | 12.75 | 9 | 9 |
| Horizontal angle of view | 24.1° | 24.0° | 24.1° | 24.2° |
| MTF (on axis) | 50% or more (30 LP/mm) | 52% or more (30 LP/mm) | 35% or more (42 LP/mm) | 38% or more (42 LP/mm) |
| MTF (maximum image height) | at least 40% (30 LP/mm) | 42% or more (30 LP/mm) | 26% or more (42 LP/mm) | 26% or more (42 LP/mm) |
| Maximum distortion | 1.0% | 1.0% | 1.0% | 1.0% |
| f1 (mm) | 17.14 | 18.62 | 12.52 | 12.06 |
| f1/f | 1.34 | 1.46 | 1.39 | 1.34 |
| D4/D1 | 2.67 | 3.00 | 2.13 | 2.05 |
| R2/R1 | 1.38 | 1.46 | 1.32 | 1.30 |
| f1/Δ | 3.13 | 3.06 | 2.94 | 2.57 |

TABLE 26

| | Example 5 | Example 6 | Example 7 | Example 8 |
|---|---|---|---|---|
| FNo | 1.2 | 1.1 | 1.0 | 1.0 |
| f (mm) | 15.3 | 15.3 | 8.83 | 8.83 |
| Horizontal angle of view | 24.1° | 24.1° | 24.0° | 24.0° |
| MTF (on axis) | 46% or more (30 LP/mm) | 50% or more (30 LP/mm) | 44% or more (42 LP/mm) | 46% or more (42 LP/mm) |
| MTF (maximum image height) | 42% or more (30 LP/mm) | 36% or more (30 LP/mm) | 27% or more (42 LP/mm) | 25% or more (42 LP/mm) |
| Maximum distortion | 1.0% | 1.0% | 3.0% | 3.0% |
| f1 (mm) | 22.07 | 21.31 | 12.14 | 11.45 |
| f1/f | 1.44 | 1.39 | 11.79 | 11.37 |
| D4/D1 | 2.00 | 2.50 | 2.92 | 2.92 |
| R2/R1 | 1.35 | 1.42 | 1.54 | 1.70 |
| f1/Δ | 3.10 | 3.15 | 2.65 | 2.83 |

Comparative Examples

Since the conventional infrared imaging lenses listed in the examples of JP2010-113191A, JP2011-128538A, JP2011-237669A, and JP2012-103461A use only conventional expensive infrared materials, they cannot be simply compared with the infrared imaging lens system 10 of the present application. However, since each of them is a two-lens system infrared imaging lens like the infrared imaging lens system 10 of the present application, so they will be explained as comparative examples below.

The infrared imaging lens of each of Examples 1 to 5 of JP2010-113191A (hereinafter referred to as Comparative Examples 1 to 5) has no aperture stop, and as shown in Table 27, all of the first lens and the second lens are formed of chalcogenide glass. Regarding the conditions of Formulas 1 to 4, there are cases where some conditions are accidentally satisfied as indicated by bold letters and underlines. However, since the conditions of Formulas 1 to 4 are not fully satisfied in each of the examples, it can be seen that JP2010-113191A does not constitute the infrared imaging lens to intentionally satisfy the conditions of Formulas 1 to 4.

TABLE 27

| | Comparative Example 1 | Comparative Example 2 | Comparative Example 3 | Comparative Example 4 | Comparative Example 5 |
|---|---|---|---|---|---|
| Material of first lens | Chalcogenide glass | Chalcogenide glass | Chalcogenide glass | Chalcogenide glass | Chalcogenide glass |
| Material of second lens | Chalcogenide glass | Chalcogenide glass | Chalcogenide glass | Chalcogenide glass | Chalcogenide glass |
| f1/f | 1.37 | 0.99 | 1.5 | 1.3 | 1.36 |
| D4/D1 | 1.55 | 3.33 | 1.67 | 1.67 | 1.04 |
| R2/R1 | 1.73 | 4.02 | 1.68 | 1.92 | 1.45 |
| f1/Δ | 4.86 | 3.96 | 5.35 | 4.97 | 4.15 |

In the infrared imaging lens of each of Examples 1 to 7 of JP2011-128538A (hereinafter referred to as Comparative Examples 6 to 12), the frontmost surface is a substantial aperture stop, and as shown in Table 28, the first lens and the second lens are formed of chalcogenide glass or zinc sulfide (ZnS). Regarding the conditions of Formulas 1 to 4, there are cases where some conditions are accidentally satisfied as indicated by bold letters and underlines. However, since the conditions of Formulas 1 to 4 are not fully satisfied in each of Examples, it can be seen that also JP2011-128538A does not constitute the infrared imaging lens to intentionally satisfy the conditions of Formulas 1 to 4.

TABLE 28

Examples 1 to 7 of JP2011-128538A

| | Comparative Example 6 | Comparative Example 7 | Comparative Example 8 | Comparative Example 9 | Comparative Example 10 | Comparative Example 11 | Comparative Example 12 |
|---|---|---|---|---|---|---|---|
| Material of first lens | Chalcogenide glass | Chalcogenide glass | Chalcogenide glass | Chalcogenide glass | ZnS | ZnS | Chalcogenide glass |
| Material of second lens | Chalcogenide glass | Chalcogenide glass | Chalcogenide glass | ZnS | Chalcogenide glass | ZnS | Chalcogenide glass |
| f1/f | 1.64 | 1.3 | 1.13 | 1.1 | 1.1 | 1.01 | 1.32 |
| D4/D1 | 1.00 | 1.00 | 1.00 | 1.00 | 1.00 | 1.00 | 1.00 |
| R2/R1 | 1.05 | 1.42 | 1.18 | 1.20 | 1.42 | 1.34 | 1.30 |
| f1/Δ | 5.10 | 3.24 | 3.52 | 3.43 | 3.31 | 3.70 | 3.06 |

In the infrared imaging lens of each of Examples 1 to 12 of JP2011-237669A (hereinafter referred to as Comparative Examples 13 to 24), the frontmost surface is a substantial aperture stop, and as shown in Tables 29 and 30, the first lens and the second lens are formed of chalcogenide glass, germanium (Ge), or zinc selenium (ZnSe). Regarding the conditions of Formulas 1 to 4, there are cases where some conditions are accidentally satisfied as indicated by bold letters and underlines. However, since the conditions of Formulas 1 to 4 are not fully satisfied in each of the examples, it can be seen that also JP2011-237669A does not constitute the infrared imaging lens to intentionally satisfy the conditions of Formulas 1 to 4.

TABLE 29

Examples 1 to 6 of JP2011-237669A

| | Comparative Example 13 | Comparative Example 14 | Comparative Example 15 | Comparative Example 16 | Comparative Example 17 | Comparative Example 18 |
|---|---|---|---|---|---|---|
| Material of first lens | Chalcogenide glass | Chalcogenide glass | ZnSe | Ge | Chalcogenide glass | Chalcogenide glass |
| Material of second lens | Chalcogenide glass | ZnSe | Chalcogenide glass | Chalcogenide glass | Chalcogenide glass | Ge |

TABLE 29-continued

Examples 1 to 6 of JP2011-237669A

|  | Comparative Example 13 | Comparative Example 14 | Comparative Example 15 | Comparative Example 16 | Comparative Example 17 | Comparative Example 18 |
|---|---|---|---|---|---|---|
| f1/f | 1.3861 | 1.2630 | 1.5447 | 1.3076 | 1.4612 | 1.7979 |
| D4/D1 | 0.78 | 0.70 | 0.93 | 0.98 | 1.93 | 2.18 |
| R2/R1 | 1.29 | 1.34 | 1.36 | 1.11 | 1.53 | 1.46 |
| f1/Δ | 1.86 | 1.79 | 1.97 | 2.28 | 1.69 | 1.97 |

TABLE 30

Examples 7 to 12 of JP2011-237669A

|  | Comparative Example 19 | Comparative Example 20 | Comparative Example 21 | Comparative Example 22 | Comparative Example 23 | Comparative Example 24 |
|---|---|---|---|---|---|---|
| Material of first lens | Chalcogenide glass | Chalcogenide glass | Chalcogenide glass | Chalcogenide glass | Chalcogenide glass | Chalcogenide glass |
| Material of second lens | Ge | Ge | Chalcogenide glass | Ge | Chalcogenide glass | Chalcogenide glass |
| f1/f | 1.8228 | 6.6570 | 1.2589 | 1.7747 | 1.2680 | 1.3076 |
| D4/D1 | 0.97 | 1.65 | 0.46 | 0.87 | 0.93 | 0.66 |
| R2/R1 | 6.30 | 0.95 | 1.34 | 1.62 | 1.45 | 1.21 |
| f1/Δ | 2.25 | 7.57 | 1.75 | 1.68 | 1.63 | 2.14 |

The infrared imaging lens of each of Examples 1 and 2 of JP2012-103461A (hereinafter referred to as Comparative Examples 25 and 26) has no aperture stop, and as shown in Table 31, all of the first lens and the second lens are formed of chalcogenide glass. The infrared imaging lens of JP2012-103461A does not satisfy the conditions of Formulas 1 to 4 even partially.

TABLE 31

Examples 1 and 2 of JP2012-103461A

|  | Comparative Example 25 | Comparative Example 26 |
|---|---|---|
| Material of first lens | Chalcogenide glass | Chalcogenide glass |
| Material of second lens | Chalcogenide glass | Chalcogenide glass |
| f1/f | 2.12 | 6.22 |
| D4/D1 | 0.44 | 0.45 |
| R2/R1 | 1.03 | 0.84 |
| f1/Δ | 4.20 | 14.41 |

As described above, the conventional infrared imaging lenses are not configured to satisfy the conditions of Formulas 1 to 4. This is because Formulas 1 to 4 are conditions unique to a two-lens system infrared imaging lens in which the first lens is formed of low-oxygen silicon and is a spherical lens, like the infrared imaging lens system 10 of the present application, and conventional infrared imaging lenses using conventional expensive infrared materials for the first lens and the second lens does not need to be configured to satisfy Formulas 1 to 4.

It is to be noted that various modifications can be made to the above embodiment and examples. For example, in addition to the infrared imaging lens system 10 mentioned in the above embodiment, it is possible to configure an infrared imaging lens equivalent in shape, arrangement and imaging performance to the infrared imaging lens system 10, by changing the curvature radius, the refractive index, and other lens data.

What is claimed is:

1. An infrared imaging lens system comprising in order from an object side:

a first lens formed of low-oxygen silicon, a concentration of oxygen contained in the low-oxygen silicon being reduced so that minimum transmittance of infrared rays with a wavelength of 8 urn to 13 μm is at least 40% for a thickness of 1 mm; and a second lens formed of chalcogenide glass, wherein the infrared imaging lens system further comprises an aperture stop disposed between the first lens and the second lens, wherein the first lens is a meniscus lens convex to the object side and the second lens is a meniscus lens convex to the image side, wherein an object side surface of the second lens closer to the aperture stop is made to be a diffractive surface, and wherein a following formula is satisfied where f represents a focal length of the entire system, and f1 represents a focal length of the first lens:

$$1.1 f1/f \leq 1.6. \qquad \text{(Formula 1)}$$

2. The infrared imaging lens system according to claim 1, wherein an object side surface of the first lens is spherical, and an image side surface of the first lens is spherical.

3. The infrared imaging lens system according to claim 1, wherein an object side surface of the second lens is aspherical, and an image side surface of the second lens is aspherical.

4. The infrared imaging lens system according to claim 1, wherein a following formula is satisfied where D1 represents a center thickness of the first lens, and D4 represents a center thickness of the second lens:

$$1.6 \leq D4/D1 \leq 6.0. \quad \text{(Formula 2)}$$

5. The infrared imaging lens system according to claim 1, wherein a following formula is satisfied where R1 represents a curvature radius of the object side surface of the first lens, and R2 represents a curvature radius of the image side surface of the first lens:

$$1.25 \leq R2/R1 \leq 1.70. \quad \text{(Formula 3)}$$

6. The infrared imaging lens system according to claim 1, wherein a following formula is satisfied where f1 represents the focal length of the first lens, and $\Delta$ represents a length between the image side surface of the first lens and the object side surface of the second lens:

$$2.4 \leq f1/\Delta \leq 3.2. \quad \text{(Formula 4)}$$

* * * * *